United States Patent
Teshima

(10) Patent No.: US 6,280,858 B1
(45) Date of Patent: Aug. 28, 2001

(54) SUBSTRATE WITH SOLDER ALLOY FOR MOUNTING ELECTRONIC PARTS

(75) Inventor: Kouichi Teshima, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/619,470

(22) Filed: Jul. 19, 2000

Related U.S. Application Data

(63) Continuation of application No. 08/936,118, filed on Sep. 24, 1997, now abandoned.

(30) Foreign Application Priority Data

Apr. 25, 1997 (JP) .................................................. 9-108487

(51) Int. Cl.⁷ ...................................................... B32B 15/04
(52) U.S. Cl. ......................... 428/639; 428/646; 428/647; 428/658
(58) Field of Search .................................. 428/659, 646, 428/647, 648, 658, 610, 939, 639

(56) References Cited

U.S. PATENT DOCUMENTS

| | | | |
|---|---|---|---|
| 1,437,641 | 12/1922 | Ferriere et al. | 420/560 |
| 3,685,487 | 8/1972 | Massa | 118/72 |
| 3,698,475 | 10/1972 | Beck, Jr. | 165/171 |
| 4,670,217 | 6/1987 | Henson et al. | 420/562 |
| 4,695,428 | 9/1987 | Ballentine et al. | 420/561 |
| 5,390,080 | 2/1995 | Melton et al. | 361/765 |
| 5,538,686 | 7/1996 | Chen et al. | 420/557 |
| 5,698,160 | 12/1997 | Chen et al. | 420/557 |
| 5,762,866 | 6/1998 | Jin et al. | 420/555 |

FOREIGN PATENT DOCUMENTS

| | | |
|---|---|---|
| 0 622 151 | 11/1994 | (EP) . |
| 0 704 272 | 4/1996 | (EP) . |
| 2 589 379 | 5/1987 | (FR) . |
| 8-243782 | 9/1996 | (JP) . |

OTHER PUBLICATIONS

Patent Abstracts of Japan, vol. 097, No. 001, Jan. 31, 1997.

Primary Examiner—John J. Zimmerman
(74) Attorney, Agent, or Firm—Foley & Lardner

(57) ABSTRACT

Disclosed is a solder alloy in use for bonding electric or electronic parts, containing: 3 to 12% by weight of a zin component; and a tin component. The oxygen content of the solder alloy is reduced to 100 ppm or less. Using the solder alloy, a bonding portion is formed on the substrate and the electronic part is mounted thereon to obtain a substrate for mounting the electronic part and a substrate on which the electronic part is mounted. The bonding portion made of the above solder alloy can prevent migration.

22 Claims, 10 Drawing Sheets

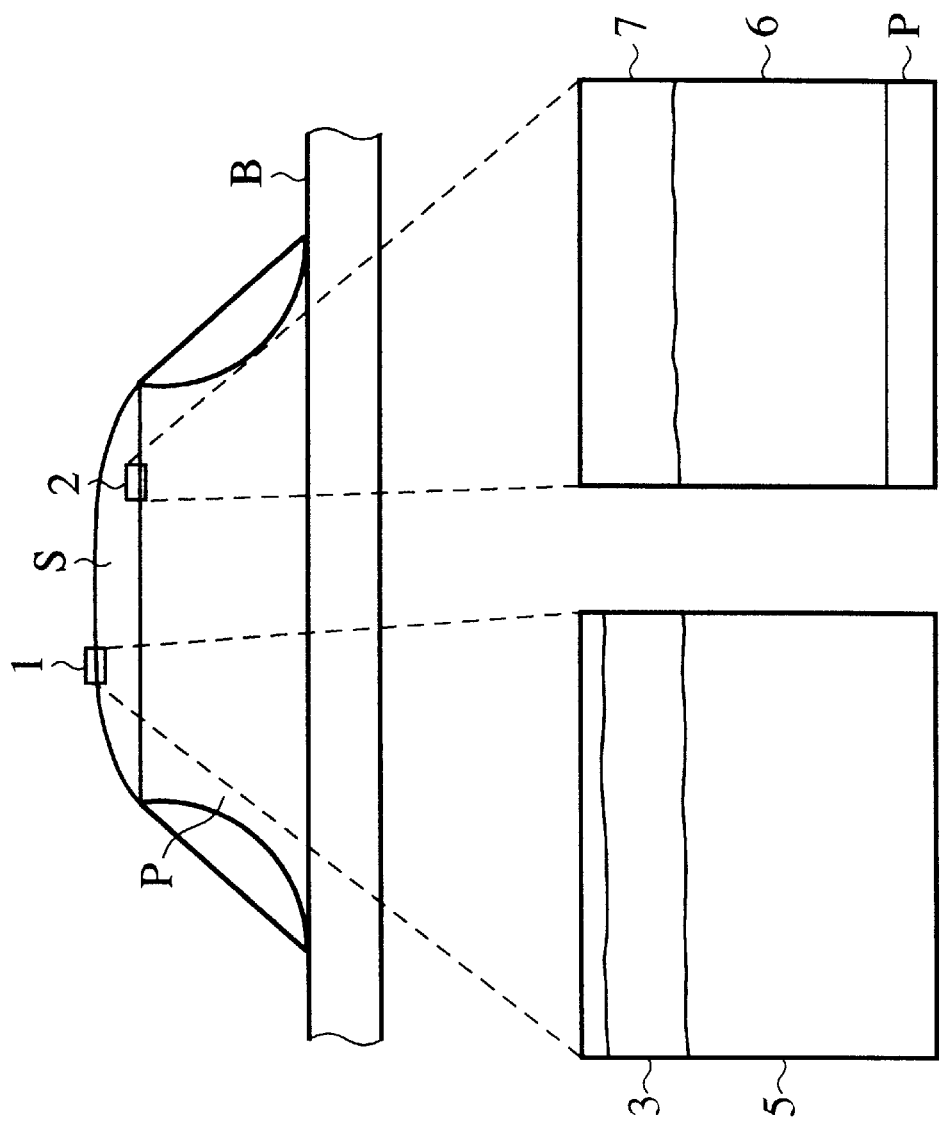

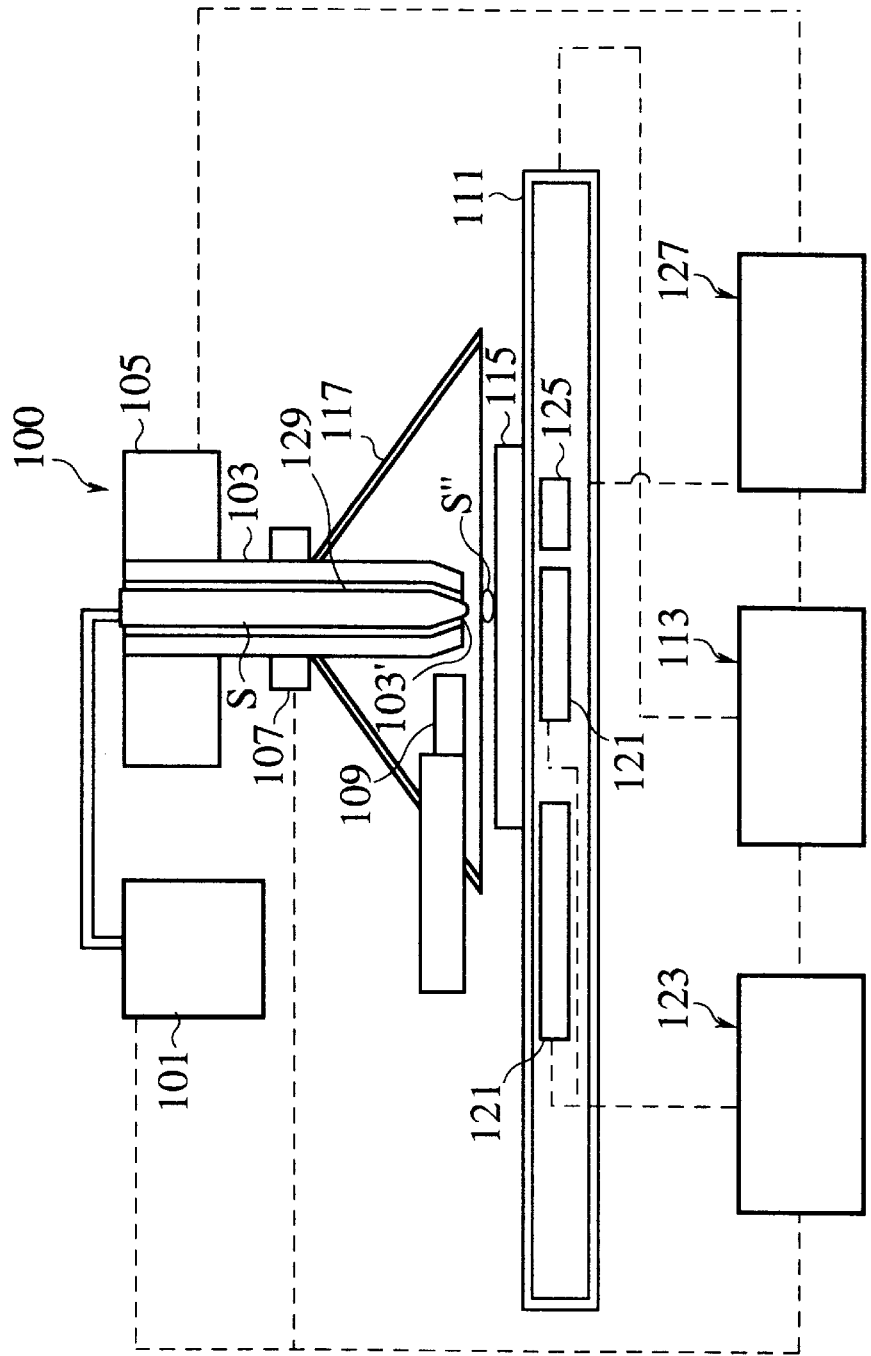

SUBSTRATE WITH SOLDER ALLOY FOR MOUNTING ELECTRONIC PARTS

This application is a continuation of application Ser. No. 08/936,118 filed Sep. 24, 1997, now abandoned.

BACKGROUND OF THE INVENTION

1. Field of the Invention

The present invention relates to a solder alloy useful for bonding of electronic parts, a substrate with the solder alloy for mounting electronic parts, a bonding member of the substrate which is to be bonded to the electronic part, and an electronic-part-mounted substrate. More particularly, the present invention relates to technique to bond an electronic part onto a substrate such as a circuit substrate and a printed circuit board substrate with use of a bonding metallic composition containing no lead, a substrate for mounting electronic parts which is suitable for application of that bonding technique with no lead, an electronic-part-mounted substrate obtained thereby, and a member which is provided on the substrate to be bonded to the electronic part.

2. Description of the Prior Art

Soldering is an art for bonding a substance by using a substance having a low melting point, and has been used since old times. It is generally said that the origin of the soldering can be traced up to ancient Mesopotamian civilization. In current industries, soldering is widely used in bonding electronic devices, for example, bonding such electronic devices as semiconductor, microprocessor, memory and resistor to a substrate. Its advantage is not only to fix a part to the substrate, but also to form electrical connection by electric conductivity of the metal contained in the solder. This point is different from organic series adhesive agents.

The solder which is generally used is eutectic solder composed of tin and lead, having a eutectic point of 183° C. This is used for bonding sheet materials of aluminum or copper. It is characterized by the eutectic point which is not only lower than the melting point of metallic base material to be soldered, but also lower than a temperature in which gasification of thermosetting resin begins. Further, it has been known that tin component of the eutectic solder forms a particular intermetallic compound on an interface with a copper plate, thereby intensifying bonding strength between the solder and copper. In addition to the eutectic solder composed of tin and lead having such a characteristic, solder composed of tin and zinc, solder composed of silver and tin, etc. have been used on trial. However, their wettabilities are poor, thereby providing a poor connectability. Thus they have not been used in actual fields.

As described above, bonding by soldering is still important in manufacture of electronic devices. In today's world in which personal electronic devices such as personal computer, mobile telephone and pager have been spreading quickly, the importance of solder in electronic device mounting technology has been intensified.

Spreading of electronic devices contributes to enrichment of people's life. However, on the contrary, if a large amount of electronic devices disused are scrapped, there is a fear that wasted electronic devices may pollute the environment.

From such a condition, bonding skill by using solder containing no lead has been demanded. However, solder in which lead is substituted by other metal or solder containing a combination of other metals cannot be handled at such a low temperature that bad influence upon the base metal by high temperatures can be avoided, and the wettability is so poor that the solder is not fixed to the base metal satisfactorily. Thus, such a solder can be applied to neither fine soldering treatment such as mounting in semiconductor devices or ordinary bonding by solder. Particularly, solder with tin and zinc has too many problems to be solved, therefore, it is considered impossible to use it for actual application in electronic mounting.

To enable use of solder without lead in fine soldering works such as thick film formation, conductor circuit formation and semiconductor mounting, a screen printing method using solder paste in which solder powder and flux are mixed has been proposed. The flux used in solder paste is generally classified to organic compound, inorganic compound and resin. In the case when organic compound or resin is used, halogen salt, organic acid salt and the like of organic acid and amino group are frequently added as active ingredient. In the case of inorganic compound, ammonium halide, zinc halide, tin halide, phosphoric acid, hydroacid halide or the like are often added. Since these additives corrode metals, inspection for corrosion due to flux residue after reflow of solder paste is necessary. Moreover, organic substance evaporating when paste is heated to remove flux, must be treated.

SUMMARY OF THE INVENTION

Accordingly, an object of the present invention is to provide a solder alloy which contains metals applicable for wide fields instead of lead which may cause environmental pollution when a product using such a solder is wasted, and which is suitable for mounting electronic parts on a substrate.

Another object of the present invention is to provide a substrate for mounting electronic parts with a bonding portion which is provided with a solder containing metals applicable for wide fields instead of lead.

Still another object of the present invention is to provide an electronic-part-mounted substrate on which the electronic part is mounted using a solder containing metals applicable for wide fields instead of lead.

Still another object of the present invention is to provide an electronic-part-mounted substrate having a bonding portion in which migration is prevented.

An solder alloy in use for bonding electric or electronic parts according to the present invention comprises: approximately 3 to 12% by weight of a zin component; and a tin component, wherein the oxygen content of the solder alloy is reduced to 100 ppm or less.

The solder alloy preferably comprises substantially no bithmus component and no indium component.

The solder alloy is substantially a binary alloy essentialy consisting of the zinc component and the tin component such that the content of other metallic component except for the zinc component and the tin component is reduced to less than 0.1% by weight.

A substantially binary solder alloy in use for bonding electric or electronic parts according to the present invention essentially consisists of: approximately 3 to 12% by weight of a zin component; a balance tin component; and an oxgen component at a content which is reduced to 100 ppm or less.

Moreover, a substrate for mounting an electronic part of the present invention comprises: an electrically conductive bonding member provided on the substrate; and a bonding portion which is formed of a solder alloy on the electrically conductive bonding member, in which the solder alloy contains a zinc component and a tin component and has a first layer at the interface of the electrically conductive bonding member and the bonding portion, and the content of the zinc component of the first layer is concentrated to approximately 70% by weight or more.

In the substrate, the first layer has a thickness of approximatley 1 µm.

The contentn of the zinc component of the first layer is 88% by weight or more.

The solder alloy has a second layer being adjacent to the first layer, and the content of the zinc compoent of the second layer is 5.8 to 11.7% by weight.

Another substrate on which an electronic part is mounted, according to the present invention, comprises: an electrically conductive bonding member provided on the substrate; and a bonding portion connecting the electronic part with the electrically conductive bonding member of the substrate, the bonding portion being formed of a solder alloy on the electrically conductive bonding member, in which the solder alloy contains a zinc component and a tin component and has a first layer at the interface of the electrically conductive bonding member and the bonding portion, and the content of the zinc component of the first layer is concentrated to approximately 70% by weight or more.

Still another substrate for mounting an electronic part, according to the present invention, comprises: an electrically conductive bonding member provided on the substrate; and a bonding portion which is formed of a metallic composition on the electrically conductive bonding member, in which the metallic composition contains a zinc component and a tin component and includes a surface layer in which the zinc component is concentrated so that the content of the tin component is at most approximately 1% by weight.

In the substrate, the surface layer has a thickness of approximately 30 to 120 Å.

In the substrate, the content of the zinc compoentn of the solder alloy is 0.5% by weight.

Moreover, a substrate on which an electronic part is mounted, according to the present invention, comprises: an electrically conductive bonding member provided on the substrate; and a bonding portion connecting the electronic part with the electrically conductive bonding member of the substrate, the bonding portion being formed of a metallic composition on the electrically conductive bonding member, in which the metallic composition contains a zinc component and a tin component and includes a surface layer in which the zinc component is concentrated so that the content of the tin component is at most approximately 1% by weight.

Another substrate for mounting an electronic part, according to the present invention comprises: an electrically conductive bonding member provided on the substrate; and a bonding portion which is formed of a solder alloy on the electrically conductive bonding member, wherein the electrically conductive bonding member has a top face and a concave side face such that appeared as a curved line in a cross section of the electrically conductive bonding member perpendicular to the substrate In the substrate, the concave side face is of a saddle shape or a hyperbola shape.

In the substrate, the curved line in the cross section is curved at a radius of less than 100 mm.

In the substrate, wherein the side face includes two incontinuous faces to form an angular portion therebetween.

In the substrate, the top face is concaved.

Moreover, a method of bonding an electronic part to a substrate with a metallic composition, according to the present invention comprises: disposing a metallic composition between the electronic part and the substrate, the metallic composition comprising 6 to 12% by weight of a zinc component and a tin component; melting at least surface of the metallic composition to wet the electronic part and the substrate with the molted metallic composition; and hardening the melted metallic composition, thereby bonding the electronic part to the substrate.

Another method of bonding an electronic part to a substrate with a metallic composition, according to the present invention, comprises: disposing a metallic composition between the electronic part and the substrate, the metallic composition comprising at least 0.5% by weight of a zinc component and a tin component; melting at least surface of the metallic composition to wet the electronic part and the substrate with the molted metallic composition; and hardening the melted metallic composition, thereby bonding the electronic part to the substrate.

BRIEF DESCRIPTION OF THE DRAWINGS

FIG. 1A is a sectional view for explanation of a structure of the substrate with a bonding portion for mounting an electronic part according to the present invention, FIG. 1B is a diagram for explanation of a surface of the bonding portion of the substrate, and FIG. 1C is a diagram for explanation of the vicinity of a bonding interface of the bonding portion;

FIG. 11 is a schematic structure diagram showing an embodiment of an apparatus for supplying the bonding material according to the present invention;

DETAILED DESCRIPTION OF THE PREFERRED EMBODIMENTS

Figure 2A:
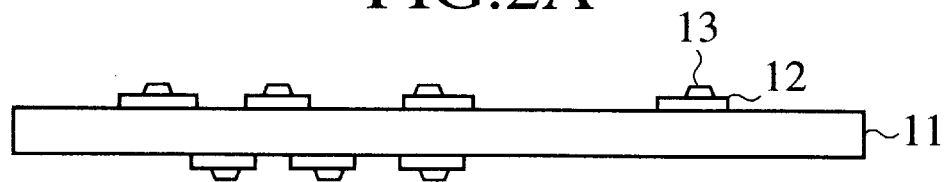
FIG. 2A is a schematic structure diagram of an embodiment of the substrate for mounting an electronic part according to the present invention.

Characteristics required for solder alloy are (1) excellent wettability, (2) ability of soldering at a temperature not thermally damaging a device to be soldered, that is, melting temperature is in the vicinity of 473 K, (3) fragile intermetallic compound or embrittlement layer is not formed by reaction with base metal, (4) ability of being supplied in a form suitable for automatization (solder paste, solder powder, etc.), (5) oxides of metallic compounds contained in solder alloy do not cause defects such as improper wetting, void, bridge and the like. Particularly, in bonding of electronic parts, since soldering is performed in fine parts, to bond an electronic part to a base metal, the surface tension, viscosity, flowability and the like of the solder alloy are important. Although conventional tin-lead solder has been often used because the aforementioned requirements are satisfied, a substitutive material has been demanded in terms of influences upon the environment.

The solder according to the present invention is an alloy containing tin and about 3–12 wt % zinc, but not lead. Zinc and tin do not affect the environment badly because it has a high safety, and further tin/zinc alloy can satisfy the aforementioned requirements for the solder.

As shown in FIG. 1, tin and zinc are solved in total range, so that, regardless of mixing ratio therebetween, an alloy is formed without producing any deposit. Thus, they are excellent in continuity assured when they are used as a solder. Particularly, tin-zinc alloy containing 3 to 12 wt % zinc has a melting temperature of less than 493 K (220° C), so that it is suitable for soldering. The composition which is most suitable for soldering is tin-zinc alloy containing about 9 wt % zinc, having the lowest melting temperature (liquidus temperature) of 471 K (198° C.). Even if the ratio of zinc is less than 3 wt % or more than 12 wt %, the melting temperature is high. Generally, it is said that if the soldering temperature for electronic parts is lower by 10° C., the service life of the electronic part becomes double. Thus, the fact that the melting temperature of the solder alloy is low is very effective.

Alloy formed in entire composition range by zinc and tin is solution alloy of tin having an excellent electric conductivity, and its characteristics such as electric conductivity are almost the same as simple tin. Its wettability to copper, which is ordinarily used as conductor in PC board and the like, is also high. Since zinc is cheaper than other metals, tin-zinc alloy can be supplied as a solder alloy which is used in large quantity for electronic devices, at about the same cheap price as the tin-lead solder alloy.

However, it has been conventionally recognized that tin-zinc alloy does not have sufficient wettability such that it can be used as a solder. Therefore, bithmus or silver has been mixed with the tin-zinc alloy to use as a solder. The present invention is based on a discovery that, if the oxygen content of the tin-zinc alloy solder is determined to be 100 ppm or less, the tin-zinc binary solder suitably wets a base of metal such as copper and the like. The reason is that it is oxygen which makes the solder alloy fragile and which reduces the wettability remarkably. Even if foreign matters such as nitrogen and hydrogen are contained in unavoidable quantity, there is no problem.

Preparation of tin-zinc alloy solder having a small amount of oxygen content can be achieved by using phosphor, magnesium or the like which have a low melting point and are likely to react with oxygen as oxygen scavenger or deoxidizer. If explaining in details, a raw zinc material is added to a raw tin material depending on the composition ration of an aimed solder alloy and melted by heating. Then phosphor of 0.01–0.1% by weight ratio is added to the melted material. As a result, oxygen in the melted material is bonded with phosphor so that it floats on the surface of the melted material as slag. Then this slag is removed and the melted material is poured into a mold and left as it hardens. As a result, solid solder in which the oxygen content is reduced to 30 ppm or less is obtained.

In common solder materials, it is permissible to add one or a combination of two or more components selected from antimony, indium, gold, silver and copper. Adding antimony or copper can further improve the wettability of the solder alloy. Adding indium, gold or silver can reduce the melting temperature of the solder alloy. If the aforementioned additive is applied to the tin-zinc alloy, the same effects can be expected. However, if the amount of these elements exceeds 3 wt %, solder gloss is vanished so that the appearance is poor. And, if such an additive component is used, it is desired to be added after the amount of oxygen in a solution of tin and zinc is reduced by using oxygen scavenger. On the other hand, binary alloy solder composed of substantially tin and zinc without using such additive component is excellent in that there is no fear in changes of solder characteristics due to generation of ternary eutectic substance or intermetallic compound after soldering. In particular, if bithmus or indium is as an additive, it becomes difficult to recover usably purified materials from the solder alloy for recycling use. Moreover, the alloy solder of tin and zinc containing no bithmus and no indium is quite preferable for bonding of electronic devices by the reason which is described below.

Since zinc is a compound easy to be oxidized, the characteristic of the tin-zinc alloy solder is likely to be damaged by generation of oxides. However, this problem can be solved by soldering in substantially non-oxidizing environment such as nitrogen and argon gas, so that wetting fault and bonding fault due to oxidization can be prevented.

If oscillatory wave energy is supplied to a surface to be soldered by ultrasonic wave or the like at the time of soldering, soldering wettability is improved.

Tin-zinc alloy solder according to the present invention can be used effectively for soldering of various electronic devices and installation and assembly of semiconductor devices. Of course, it can be used for application field in which conventionally tin-lead solder has been used.

(Surface Zinc Layer)

As integration of semiconductor devices such as circuit substrate and IC chips is increased, a bonding member for electrically connecting the semiconductor devices together or a semiconductor device with other parts, i.e. pads, wiring parts, etc., has become fine. Thus, the bonding by soldering for bonding these parts also has become fine. If such fine bonding is formed by the conventional tin-lead solder, generation of migration is currently a problem.

According to the present invention, it has been found that a bonding formed by soldering of a substrate with a solder containing tin and zinc can prevent generation of migration. As a result of research on this reason, it has been found that the melted solder containing tin and zinc is hardened so as to produce an outer peripheral portion or a surface layer in which the zind component is highly concentrated so that does scarecely contain tin (1 wt % or less detected by Auger Electron Spectroscopy), which will be called "a surface zinc layer" hereinafter, thereby preventing a migration.

The surface zinc layer, which is formed on the hardened material of the melted solder containing tin and zinc can be classified into two categories. One is (1) surface zinc layer which is formed on the surface of a hardened substance (particularly a portion adjacent to atmosphere) having a thickness of about 40 to 120 Å, containing little tin (at most 1 wt %). Another is (2) surface zinc layer which is formed on an interface with a metallic bonding part, having a thickness of 0.5 to 2 $\mu$m. The surface zinc layer of (1) is ordinarily composed of zinc containing oxygen (or oxidized zinc). If oxygen is remarkably removed from the atmosphere in which the soldering is carried out, the surface zinc layer of (1) may be divided into an outer layer located on the most surgical portion, composed of zinc containing oxygen, and an inner layer located insider thereof containing little oxygen. The surface zinc layer of (2) contains a small amount of oxygen. In the surface zinc layer of (2), nearer the surface, the amount of tin decreases and a ratio of zinc increases. The most surface portion of the layer (2) contains little tin. The zinc content on average of the surface zinc layer of (2) varies depending on composition of the melting solder, and it is generally at least about 70 wt %.

It is considered that the surface zinc layers of (1) and (2) are different in formation process. The surface zinc layer of (1) seems to show such an inclination that zinc is formed in thin layer on the surface of the melted material due to a difference in physical property such as surface tension or the like, and this thin layer is hardened so as to produce a surface zinc layer. The surface zinc layer of (2) seems to show such a inclination that, if the melting solder makes contact with a metal (or a specific substance like copper, etc.), zinc moves toward that metal and it is then concentrated in the vicinity of the bonding interface so as to form a layer of (2). Because zinc is a metal likely to be oxidized, zinc existing on the surface of the melting substance absorbs oxygen in the environment, so that the layer containing oxygen like the aforementioned (1) is formed so as to inhibit penetration of oxygen inside thereof.

Thus, if metallic composition containing tin and zinc goes through a process of melting and then hardening, the hardened material is so structured to have a surface zinc layer. Accordingly, if a bonding portion is formed by using a melted tin-zinc composition correspondingly, it has little tin on its surface, thereby preventing migration.

Thus this material is suitable for bonding of high density mounting substrates.

If actually substrate pad is soldered with tin-zinc eutectic solder, the condition shown in FIG. 1 is obtained. FIG. 1A is a sectional view of a soldered substrate, in which, if a surface portion 1 of solder S covering the pad P of the substrate B is analyzed in the depth direction according to Auger electron spectroscopy method, a structure in the vicinity of the surface is expressed as FIG. 1B. According to this expression, zinc oxide layer 3 having a thickness of about 30 to 120 Å exists on the most external surface and below this, a layer 5 in which tin and zinc are mixed exists. On the other hand, if a portion 2 in the vicinity of a bonding interface between the solder S and the pad P is analyzed, as shown in FIG. 1C, zinc layer 6 containing a little amount of oxygen (1–30 ppm) and having a thickness of about 0.5 to 2 $\mu$m exists on the interface, and above this, a layer 7 in which tin and zinc are mixed exists. The layer 5 in FIG. 1B is continuous with the layer 7 in FIG. 1C. Although a ratio of content of zinc in the layer 6 is more than 70 wt % at average of the entire layer, the most surface portion contains little tin.

As understood from the above description, if a bonding portion is formed in accordance with a method using a process of melting-hardening by use a metallic composition containing tin and zinc, a surface zinc layer corresponding to the above (1) is formed. If bithmus or indium is contained in that metallic composition, it inhibits the surface zinc layer of (1) from being formed on the hardened composition. Thus, the bonding portion according to the present invention is preferred to be formed with binary composition of tin/zinc, although it is not restricted to the binary composition and may contains other components except for bithmus and indium. Moreover, because there is no fear in changes of physical property due to generation of ternary eutectic substance after mounting if looking from viewpoints of bonding of the substrate, the binary compomposition of tin-zinc is favorable. Particularly because of good economic performance ensured by low melting point, tin-zinc eutectic composition (zinc=about 9 wt %) is desirable.

When the melted metallic composition contains zinc, an obtained hardened material contains surface zinc layer. If the amount of contained zinc is small, it is considered that formation of the surface zinc layer is insufficient. Table 1 shows a result of research on a relation between the ratio of contained zinc and generation of migration when substrate are bonded by using metallic composition in which the amount of contained zinc differs. In this table, a case when a bonding having migration is 0 is shown by a letter A, a case when the bonding having migration is less than 20% is shown by a letter B and a case when the bonding having migration is more than 20% is shown by a letter C.

TABLE 1

| Ratio of zinc content (wt %) | 0 | 0.01 | 0.1 | 0.5 |
|---|---|---|---|---|
| Generation of migration | C | B | B | A |

From Table 1, it has been found that the tin-zinc solder can prevent generation of migration in fine bonding portions when the solder in which lead is mixed at a ratio of 0.01 wt % or more, preferably at the ratio of 0.5 wt % ore more.

Thus, in a bonding portion having the surface zinc layer on its surface, migration in a high density mounting bonding such as bonding of a bump or lead which is arranged with an interval of 1 mm or less is prevented effectively.

As is evident from the above description, the bonding portion achieved by tin and zinc through a process of melting and hardening gets a structure of having the surface zinc layer, following a mechanism in which the above zinc layer (1) is formed. Since migration is prevented by formation of zinc layer on the surface and then substantial nonexistence of tin on the surface, the bonding portion formation method should not be restricted to soldering, but the composition containing tin and zinc forms a bonding portion through the process of melting-hardening. Of course, it is permissible that the entire bonding composition is not melted, but only the surface portion is melted. Or a structure in which zinc layer is formed on the bonding portion, regardless of mechanism in which the zinc layer is formed is also permissible. Thus, a formation method for the bonding portion may be selected appropriately depending on requirement, from for example, welding methods including arc welding, electronic beam welding, plasma arc welding, laser welding and optical beam welding; press-welding methods including resistance welding, cold welding, friction welding and diffusion welding; hard brazing methods including resistance brazing and vacuum brazing; and soldering methods including laser brazing and immersion brazing. Or it is permissible to use a solder supplying unit, in which solder particles are transported to a portion to be bonded by using inactive gas as carrier, and in which the solder particles transported are heated in such a condition that the surface of the solder particles is being melted, when they arrive at the material to be bonded, so as to wet the materials to be bonded with the solder.

A bonding portion having the surface zinc layer can be formed on various substrates. For example, paper substrate copper stretching integrated board such as a paper-phenol substrate copper stretched integrated board and paper-epoxy substrate copper stretched integrated board; a glass substrate copper stretched integrated board such as glass clothing epoxy multi-layer wiring board and glass clothing polyimide multi-layer wiring board; composite copper stretched integrated board such as epoxy composite copper stretched integrated board, ceramic substrate such as flexible wiring board, multi-wire board, thick film circuit substrate and thin film circuit substrate; multi-layer wiring substrate in which various materials are combined; composite substrate such as enameled substrate and metallic base substrate; and silicone substrate which is a semiconductor material are provided.

If classified in terms of substrate mounting style, single surface mounting, double surface mounting, double surface mounting equipped with lead attached parts, single surface mounting equipped with lead attached parts, lead through mounting, and the like are provided. The mounting part include ceramic, capacitor, inductor, jumper, transistor, diode, aluminum electrolytic capacitor, tantalum semi-fixed resistor, trimmer, coil and the like, as a passive part. As an active part, it includes IC and SI, which are typical parts. If classified depending on external shape and configuration of the package, SOIC, SOP, QIP, QFP, PLCC, LCC, SOJ, MSP, BGA, FC-BGA, CSP, PLC, MCM, OE-MCM, and high density mounting device in which chips are stacked are available.

Further, this is applicable to not only field of mounting substrate, but also other fields. For example, that field includes bonding of IC package and CPU for use in semiconductor field, bonding of electric circuit in a hard disk or LCD panel contained in personal computer, cable connector often used in connection of personal computer and printer, optical connector often used in transmission cable, bonding of a radiator of vehicle and the like.

Figure 2B:
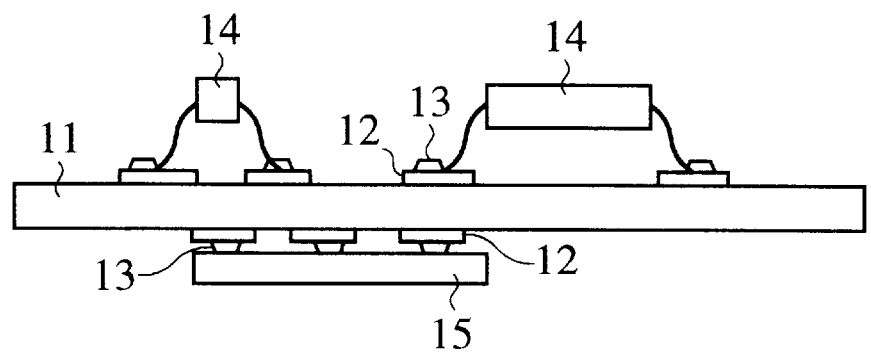
FIG. 2B is a schematic structure diagram of the electronic-part-mounted substrate, on which the electronic part is mounted.

FIG. 2A shows an example of a substrate in which a bonding portion having a surface zinc layer is formed on the pad. On an electrically conductive pad 12 provided on the substrate 11 made of resin is formed a bonding portion 13 by tin-zinc solder. For example, as shown in FIG. 2B, on one side of the substrate 11, such parts as resistors, QFP and the like are connected with the pad 12 through the bonding portions 13. On the other side thereof, a part such as a display unit is connected with the pad 12.

Figure 3A:
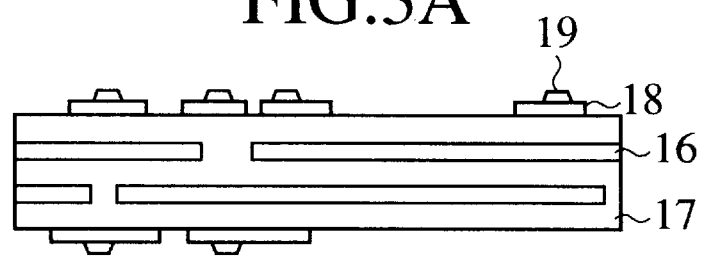
FIG. 3A is a schematic structure diagram of other embodiment of the substrate for mounting the electronic part according to the present invention.
Figure 3B:
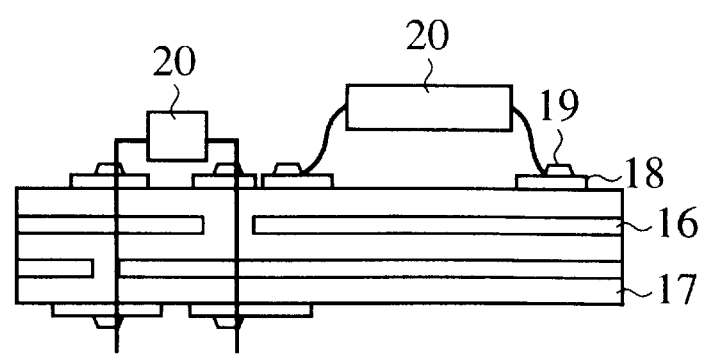
FIG. 3(b) is a schematic structure diagram of an embodiment of the electronic-part-mounting substrate on which the electronic part is mounted.

FIG. 3A shows an example of a multi-layer substrate in which a bonding portion having a surface zinc layer is formed on the pad. On the pad 18 provided on the surface of the multi-layer substrate 17 made of resin, containing a copper conductive layer 16 inside thereof is formed a bonding portion 19 composed of tin-zinc solder, and then, for example as shown in FIG. 3B, a part 20 is connected to the pad 18 through the bonding portions 19.

(Zinc Layer on Bonding Interface)

If an amount of oxygen is small, that is, the content of oxygen in solder is less than 100 ppm, the wettability of zinc is not so inferior to that of lead. Therefore, the tin-zinc solder indicates a sufficient wettability and the layer composed of mainly zinc such as the surface zinc layer of (2) mentioned above acts like adhesive agent so that it bonds a member to be bonded favorably. Particularly if the amount of zinc in the layer is about 88–99.5 wt %, a bonding having an excellent tensile strength is formed. This is very effective for bonding a member to be bonded such that the surface is composed of a metal like copper, silver, nickel, gold, palladium, platinum and iridium. Particularly the wettability to copper, silver and gold is excellent.

In other words, if a layer composed of mainly zinc having a small amount of oxygen like the surface zinc layer of (2) is made to intervene, soldering of metallic parts can be carried out excellently. Thus, it is not necessary to restrict the layer composed of mainly zinc to a layer caused from melted solder. Thus, the layer composed of mainly zinc can be formed not only by various welding methods, pressure welding methods and brazing methods which are described above in formation of the bonding portions, but also may be formed directly on a member to be bonded through a plating method or the like. In a case when the member to be bonded is composed of a material to which the wettability of zinc is not so good, the surface of the member to be bonded is covered with copper, silver, gold or the like, before a layer composed of mainly zinc is formed.

If bonding is formed through melting in such a condition that a layer composed of mainly zinc exists between a member to be bonded and tin-zinc alloy, a bonding portion having an excellent tensile strength is formed by tin-zinc alloy on the member to be bonded through a layer composed of mainly zinc. For formation of this bonding, various methods including welding method, pressure welding and brazing method described previously are available. According to this method, tin-zinc alloy is formed on a member (wiring, pad, etc.) to be bonded of various substrates, mentioned in a description of the surface zinc layer, through a layer composed of mainly zinc. This method is applicable for various mounting styles and can correspond to high density mounting. Or this may be used for bonding and assembly of the aforementioned electric/electronic parts and mechanical parts.

When tin-zinc alloy solder is melted and a substrate is dipped therein, bonding is achieved by placing the solder on the bonding portion of the substrate. In this case, as described above, solder is bonded in such a manner that a layer composed of mainly zinc of the above (2) is disposed on an interface of the member to be bonded, and the surface has a surface zinc layer of the above (1). If the solder which is in contact with the member to be bonded is in melting state for a long time, some component in the member to be bonded are gradually diffused so as to penetrate into the layer existing on the bonding interface and being composed of mainly zinc. At the same time, zinc penetrates into the surface of the member to be bonded. Thus, if the member to be bonded is in contact with the melted solder for a long time after bonding, the layer composed of mainly zinc of the above (2) is likely to change in its composition.

The substrate having the above-described bonding portion on a member to be bonded is advantageous in preventing the resist portion of the substrate from being damaged.

(Shape of Member to be Bonded)

Figure 4A:
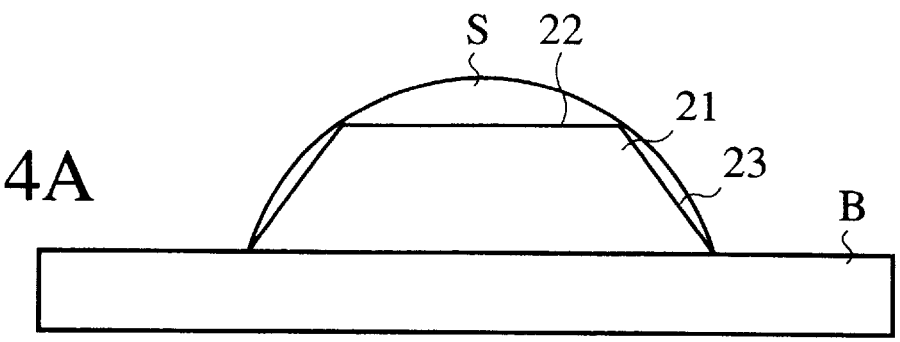
FIGS. 4A and 4B show vertical sectional views for explanation of an embodiment (FIG. 4A) and other embodiment (FIG. 4B) in which the bonding portion is formed on a bonding member of the substrate for mounting the electronic part, using a bonding material, respectively.
Figure 4B:
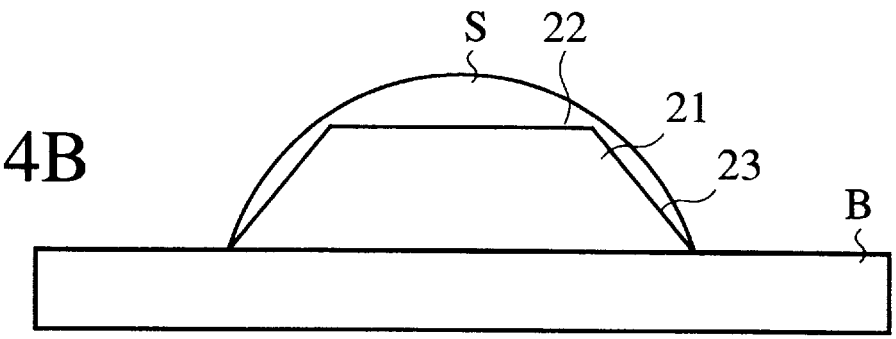
Figure 5A:
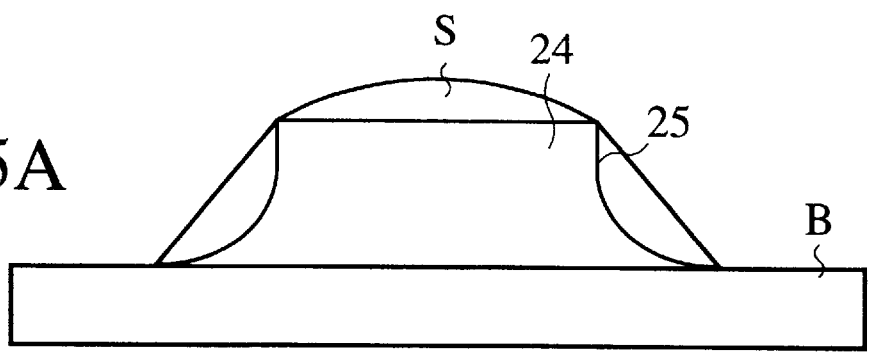
FIGS. 5A and 5B show vertical sectional views for explanation of an embodiment (FIG. 5A) and other embodiment (FIG. 5B) in which the bonding portion is formed using a bonding material, on an example of the bonding member of the substrate for mounting the electronic part according to the present invention.
Figure 5B:
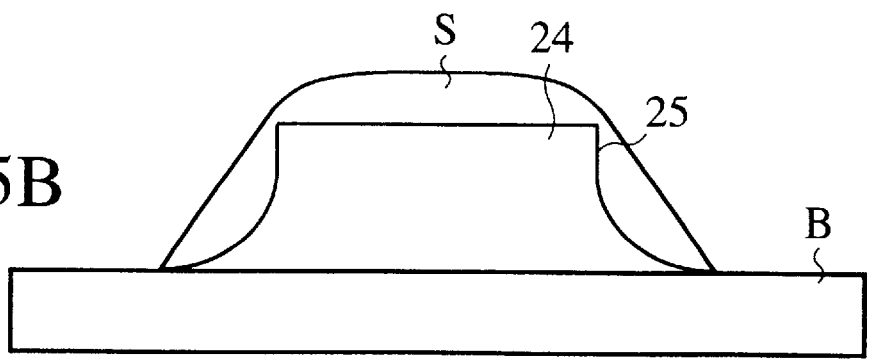

When a bonding portion is formed on a member to be bonded such as a pad or wiring by using the aforementioned metallic composition as solder, elements to determine the strength of the bonding include a shape of the member to be bonded. In the case of a pad 21 in which the cross section is trapezoidal like in FIG. 4A and FIG. 4B, the solder S applied is in contact with not only a top face 22 of the pad 21 but also inclined side faces 23, so that the area of the bonding interface is increased, thereby securing a bonding strength between the bonding portion and the member to be bonded. Regarding this point, as a shape further advantageous of the member to be bonded, a shape shown in FIGS. 5A and 5B can be presented. In FIGS. 5A and 5B, the side faces 25 of the pads 24, inclined relative to the substrates, draw curved lines in sectional view, and each of the curved lines is concave, that is, of a saddle type, hyperbola type and the like. In this case, the area of the bonding interface is larger than the pad 21, so that a sufficient bonding strength is easier to obtain. Further, because the side face thereof is concave, solder adhering thereto is settled favorably, which is effective in enhancing the wettability of solder. Still further, because the side face has concavities, a resistance to distortion along the substrate caused in the bonding portion due to a change in dimension of the substrate accompanied by a change in temperature is increased.

Referring to FIGS. 4A, 4B, 5A and 5B, each of the drawings of A indicates a case in which the amount of solder is small and that of B indicates a case in which the amount of solder is large. By forming the side face in a concave shape, an amount of solder which can be supported by the side face is increased, so that it is possible to mount solder on the pad stably. Consequently, adaptability when the amount of solder to be applied changes is also increased.

Figure 6A:
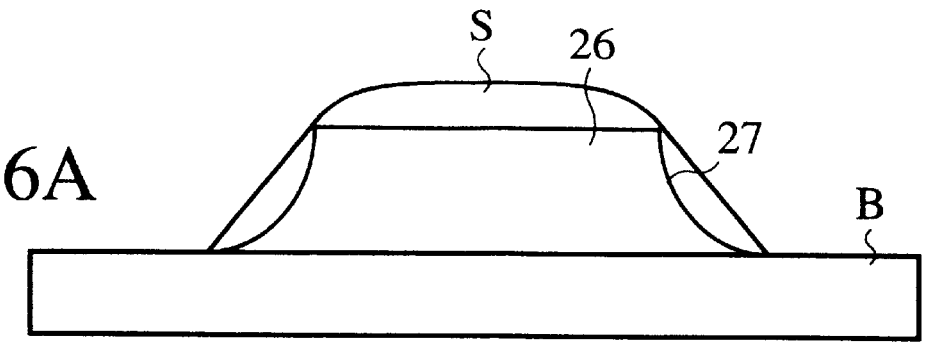
FIGS. 6A and 6B show vertical sectional views for explanation of an embodiment (FIG. 6A) and other embodiment (FIG. 6B) in which bonding portion is formed using a bonding material, on another example of the bonding member of the substrate for mounting the electronic part according to the present invention.
Figure 6B:
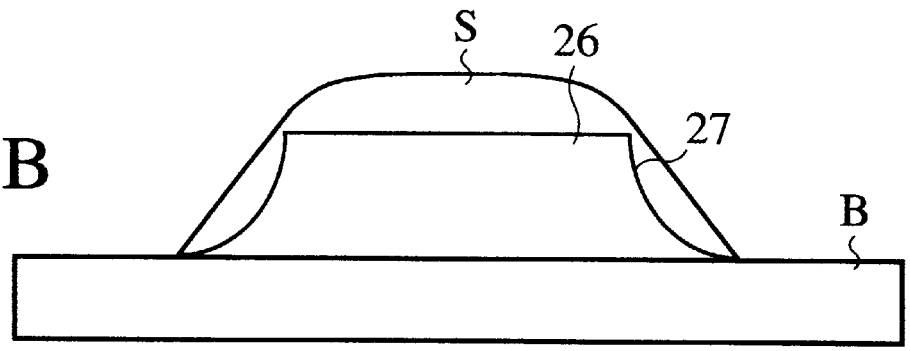

FIGS. 6A and 6B show an example in which the concavities in the side faces of the pads are different. FIG. 6A shows a case in which the amount of solder is small. FIG. 6B shows a case in which the amount of solder is large. Since the concavity of the side face 27 of the pad 26 in FIGS. 6A and 6B is milder than that in FIGS. 5A and 5B, the area of the bonding interface is smaller than in the case of the pad 24, so that the amount of solder to be mounted on the side face 27 is smaller. An advantage in forming the inclined side face of the pad in concave shape becomes conceivable if the radius of curvature of the side face is less than 100 mm. It is desirable that there are many places or portions which satisfy this requirement on the side faces.

Figure 7A:
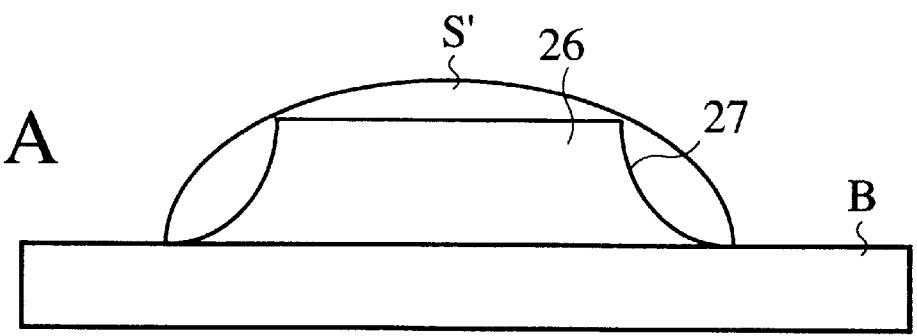
FIGS. 7A and 7B show vertical sectional views for explanation of an embodiment (FIG. 7A) and other embodiment (FIG. 7B) in which the bonding portion is formed using another bonding material, on the bonding member in FIGS. 6A and 6B.
Figure 7B:
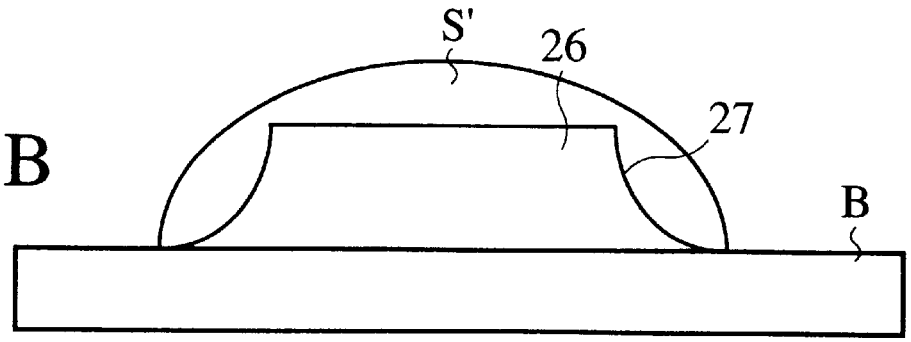

FIGS. 7A and 7B show an example in which the wettability of solder is low. Generally, if the wettability of solder is low, the wetting angle is increased so that the stability of solder on the pad side faces or holding performance is likely to drop. However, if the side face is concave, as shown in FIG. 7, the holding performance of the solder S' is not reduced so much, so that a sufficient performance for correspondence is secured in the case when the amount of solder is small as well as in the case when the amount of solder is large. This can be understood easily if considering that solder having a low wettability is used in case of the pad 21 shown in FIGS. 4A and 4B.

Figure 8A:
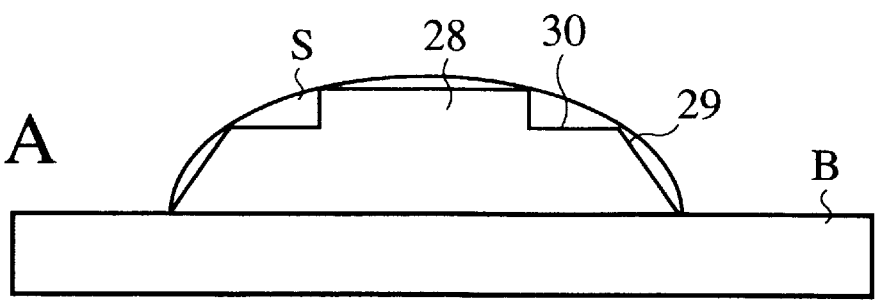
FIGS. 8A and 8B show vertical sectional views for explanation of an embodiment (FIG. 8A) and other embodiment (FIG. 8B) in which bonding portion is formed using a bonding material, on still another example of the bonding member of the substrate for mounting the electronic part according to the present invention.
Figure 8B:
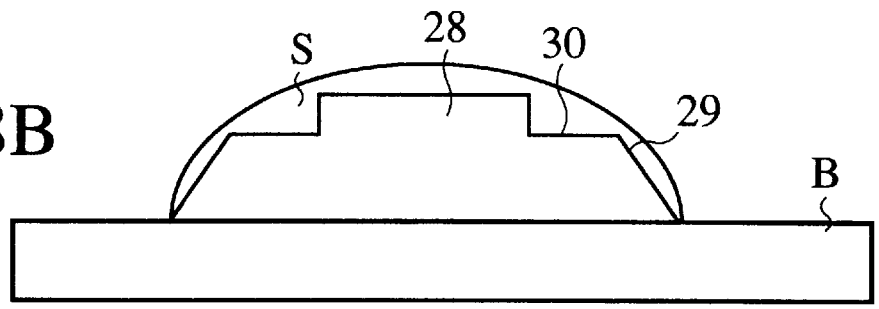
Figure 9A:
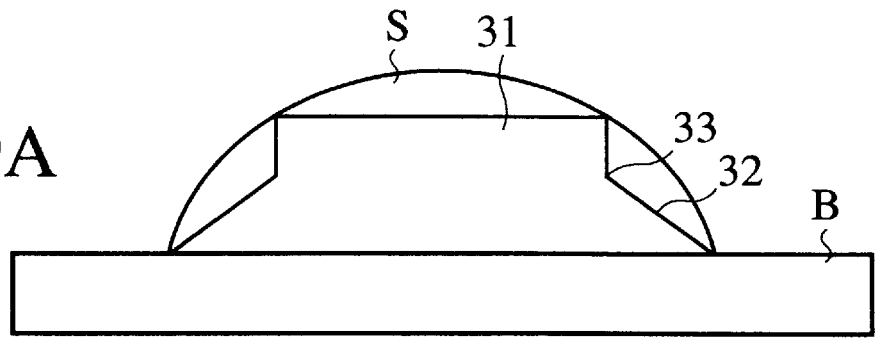
FIGS. 9A and 9B show vertical sectional views for explanation of an embodiment (FIG. 9A) and other embodiment (FIG. 9B) in which the bonding portion is formed using a bonding material, on a further example of the bonding member of the substrate for mounting the electronic part according to the present invention.
Figure 9B:
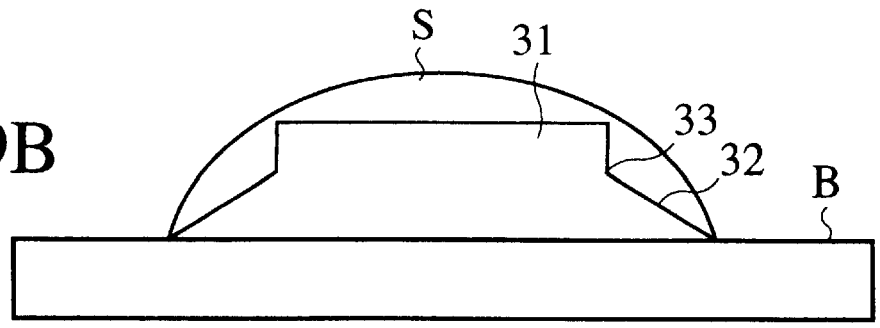

Although FIGS. 5–7 show cases in which the inclined side faces of the pads are continuously concave, it is possible to obtain a similar effect in pads in which concave portions are formed by incontinuous faces as shown in FIGS. 8A, 8B, 9A and 9B. A pad 28 in FIGS. 8A and 8B is provided with a step portion 30 at a side face 29. A side portion 32 of a pad 31 shown in FIGS. 9A and 9B is formed of two incontinuous faces so as to form an angular portion 33 thereby providing a concavity. In any pads, the area of the bonding interface is increased by the step portion 30 and the angular portion 33, so that the holding performance of solder S is improved. A sufficient performance for correspondence is assured in the case of 8A or 9A when the amount of solder is small and in the case 8B or 8B when the amount of solder is large.

Figure 10A:
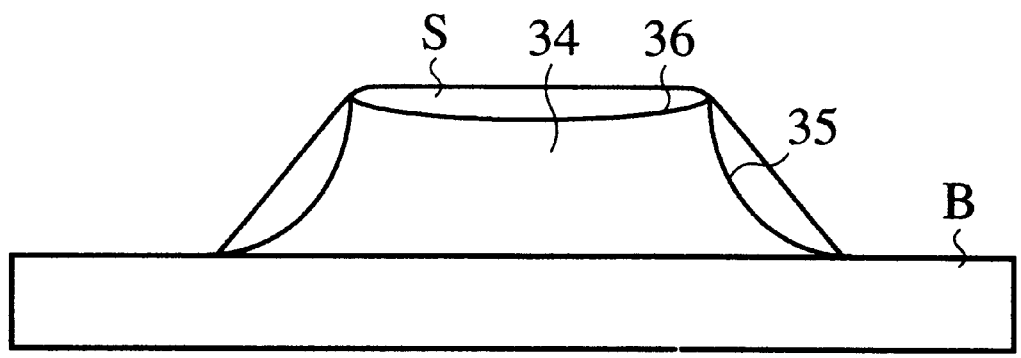
FIGS. 10A and 10B show vertical sectional views for explanation of an embodiment (FIG. 10A) and other embodiment (FIG. 10B) in which the bonding portion is formed using a bonding material, on a still further example of the bonding member of the substrate for mounting the electronic part according to the present invention.
Figure 10B:
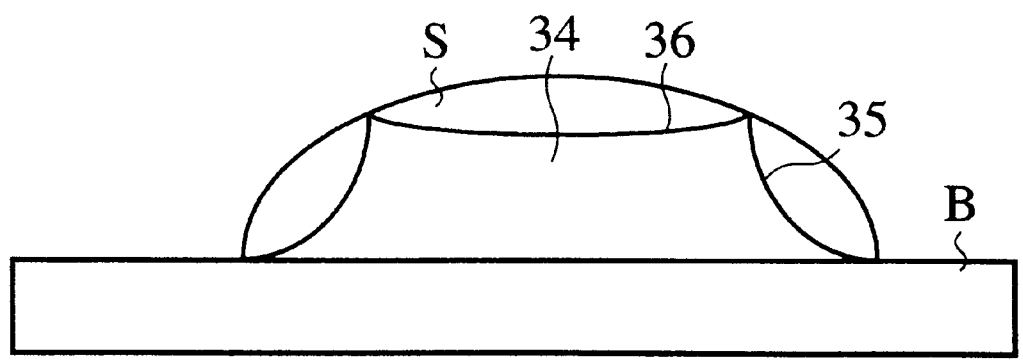

FIGS. 10A and 10B show an example in which the area of the interface is further increased. In this case, concave faces are formed in not only the side face 35 of the pad 34 but also the top face 34 thereof. The side face 35 is concave like in the case of FIGS. 5 to 7, and the top face 34 is also inclined toward the center. These structures can correspond to the case when the amount of solder is small and the case when the amount of solder is large, like the cases of FIGS. 5 to 9.

The above FIGS. 5 to 10 show vertical sectional views. The entire pad configurations are so structured as shown in this vertical sectional views. Thus, it can be easily understood that the above configurations can be applied to substantially truncated cone or substantially truncated polygon pyramid pads for point bonding, having top and bottom circles or polygons, and substantially frustum wiring or the like which extends in a longitudinal direction and has a trapezoidal cross section, so that the cross sections are as shown in FIGS. 5–10.

(Solder Supplying Means Having Oxide Film)

A means for supplying the aforementioned metallic composition containing tin and zinc to a member to be bonded, that is, an embodiment of a means for soldering may be a means which supplies melted material onto the member to be bonded through fine openings like a nozzle and a screen. In such a means, shutting out of the melted material in the opening is very important so as to form fine bonding portions. As regards this point, by forming a metallic oxide film on the surface of the opening for supplying the melted material, the shut-out of the melted material is improved. This utilizes such a characteristic that the surface of the metallic oxide solid can reject melted metal easily. As a result, this characteristic prevents the melted metal from stagnating on the metallic oxide film or adhering to the wall face. By covering the opening end and screen slit of the nozzle with metallic oxide film, shut-out of the melted metal at the film position is improved. As a result, narrowing or clogging of the nozzle opening and slits does not occur, so that very narrow nozzles can be used. Therefore yield rate is improved so that cleaning work for the nozzle and slit becomes unnecessary. Further, if the shut-out of the melted metal is improved, the supply thereof can be controlled strictly, so that the melted metal can be supplied accurately to fine portions. Concretely speaking, in the case of soldering fine wiring or pads having an interval of less than 100 μm, it is possible to prevent formation of bridges.

The metallic oxide for covering the opening is not restricted, and may be oxide of metallic element contained in the melted metal. However, in the nozzle or screen for use as a means for supplying tin-zinc solder, metallic oxide such as spinel type chromate oxide is preferable, because it can be formed easily on the surface of stainless steel and thus it can be used easily and favorable in the apparatus configuration. The spinel type chromate oxide can be formed in the thickness of 1 μm on the surface of stainless steel by chrome contained in stainless steel by heating the stainless steel at more than 1300° C.

As a means for discharging the melted metal from the nozzle, a type of using vibration energy and thermal energy as well as a pump for ordinary use can be used. According to the type of the vibration energy, by applying vibration energy such as ultrasonic wave to the nozzle, the melted metal is discharged from the nozzle tip in the form of droplet. According to the type of the thermal energy, by applying heat to the nozzle cyclically, the surface tension of the melted metal in the nozzle is partially changed so as to discharge the melted metal in the form of droplet. When the melted metal is discharged in the form of droplet, covering the opening at the nozzle tip with metallic oxide is very effective. Particularly, if the nozzle opening is formed in tapered form, shut-out of the melted metal is further improved. As for the screen, if the screen is formed such that the slit is slightly open forward, an operation for removing the screen is facilitated.

(Nozzle Unit)

FIG. 11 shows an example of the nozzle type soldering apparatus according to the present invention. This soldering apparatus 100 comprises a melting bath 101 for heating and melting the solder, a nozzle 103 connected to the melting bath 101, an oscillating unit 105 attached to the nozzle 103, a heating means 107, a gas supplying unit 109 for supplying inactive gas and a transfer unit 111. On an inside wall of the nozzle 103 formed is an metallic oxide film 129 of chromium oxide. The solder is thrown into the melting bath and melted by heating. After that, the melted solder is supplied to the nozzle 103 at a constant speed. Elastic wave oscillated from the oscillating unit 105 is transmitted to the melted solder S in the nozzle 103. Consequently, the solder S is made to droplet S" and regularly discharged from the nozzle port 103' of the nozzle 103. The droplet S" discharged from the nozzle 103 reaches the substrate 115 which is a base metal placed on the transfer unit 111. The nozzle 103 is provided with a hood 117 for preventing oxidation of the droplet S by inactive gas supplied from the gas supplying unit 109. A controller 113 has a positioning control function for controlling the transfer speed of the transfer unit 111 so that the droplet S" reaches an appropriate position on the substrate 115. The transfer unit 111 has an oscillator for supplying elastic wave to the substrate 115. The wave length of the elastic wave transmitted by the oscillator 125 and the oscillating unit 105 is controlled by a frequency adjusting unit 127.

In the above apparatus, the oscillating unit 105 is used as a means for discharging solder, and it may be substituted by known means with spark or bubbles used in ink jet technology.

An example of injecting, for example, solder in which, in terms of composition ratio, tin is at least 90.9 wt %, zinc is 9 wt %, other metallic element content is less than 0.1 wt % and oxygen content is less than 5 ppm (eutectic point: 198° C.) by using the aforementioned soldering unit 100 will be described below.

First, solder is thrown into the melting bath 101 and by supplying nitrogen from the gas supplying unit 109 to the vicinity of the nozzle 103 as inactive gas, the solder in the melting bath 101 is held at 208° C. so as to be melted completely. The melted solder is sent to the nozzle 103 and elastic wave output is supplied from the oscillating unit 105 to the melted solder S. As a result, fine solder droplets S" are discharged from the nozzle 103. The solder droplet S" reaches a predetermined position on the substrate 115, so that the solder droplets S are stacked and hardened, thereby gradually increasing the thickness of solder. With this condition, if the transfer unit 111 is moved horizontally at a constant speed, spots or a line is formed by solder particles on the substrate. By supplying elastic wave to the substrate 115 by the oscillating unit 125, when the solder droplet S" comes into contact with the substrate 115, the oxide film on the surface of the substrate 115 is diffused so that the wettability is improved.

By soldering operation using the aforementioned nozzle, soldering in spots of 5 μm to 50 μm in diameter or soldering in line of the same width is enabled.

A heating/cooling unit 121 of the transfer unit 111 is used to control hardening of the solder on the substrate and can be used to increase the thickness of the applied solder. For example, if the temperature of the substrate is lowered below the eutectic point of the solder, the solder droplet reaching the surface of the substrate begins to be hardened. If this substrate is reheated over the eutectic point, the hardened solder begins to be melted again so that semi-melting condition in which liquid phase and solid phase are mixed is generated. The surface tension of solder in this condition is larger than that of the completely melted solder. Even if new solder droplet is added to semi-melting condition solder, it is not stretched horizontally but integrated with the semi-melting condition solder so that it is hardened. As a result, solder film having a sufficient thickness is obtained. Thus, a location and temperature of the heating/cooling unit 121 of the transfer unit 111 are determined so that new solder droplet can be added to solder in the semi-melting condition on the substrate 115. As a result, by stacking soldering spots by means of a plurality of the nozzles, thick soldering film is formed.

Figure 12:
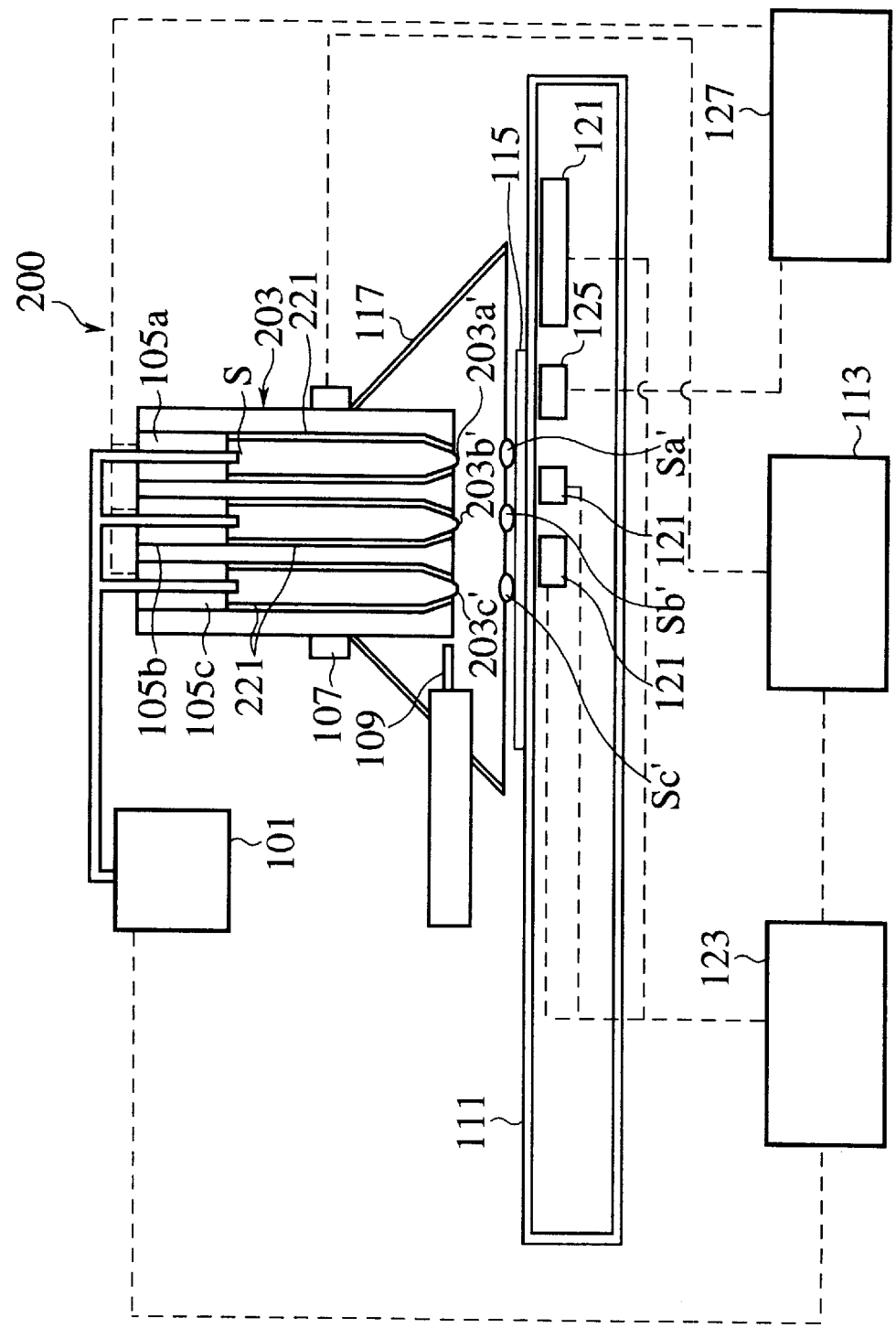
FIG. 12 is a schematic structure diagram showing another embodiment of the appratus for supplying the bonding material according to the present invention;.

A soldering apparatus 200 shown in FIG. 12 comprises a nozzle 203 having a plurality of nozzle ports 203a', 203b' and 203c'. On the inside walls of the nozzle 203 formed is a metallic oxide film 221 of chromium oxide. Solder droplets 5a', 5b' and 5c' are discharged from the respective nozzle ports by oscillating units 105a, 105b, and 105c and reach the substrate 115. Parts having the same reference numerals as in FIG. 11 perform the same action as corresponding parts of the slodering unit 100, thus a description thereof is omitted.

The soldering method mentioned in the present invention can be executed by using a nozzle unit in which vibration energy is supplied from the nozzle itself to a base metal to be soldered. For example, the following nozzle unit is available. An elastic wave oscillator is provided in the vicinity of a nozzle connected to a melting bath in which solder is melted under non-oxidizing environment and the nozzle is sheathed so that the nozzle tip is covered with non-oxidizing gas environment and non- oxidizing gas such as nitrogen is circulated in the sheath. While supplying non-oxidizing gas to the nozzle tip of such a nozzle unit, the nozzle is approached to the base metal to be soldered, and then the nozzle tip is made into contact with the base metal. While making melted solder supplied from the melting bath to the nozzle tip in contact with the base metal, vibration energy is applied to the nozzle. After that, the nozzle is taken away from the base metal while a predetermined amount of the solder is pushed out from the nozzle tip. With this operation, soldering in fine parts can be done. It is permissible to keep the nozzle tip slightly away from the base metal and supply vibration energy while only the melted solder is kept into contact with the base metal. By moving the nozzle while the melted solder is pushed out continuously, linear soldering can be carried out.

Figure 13:
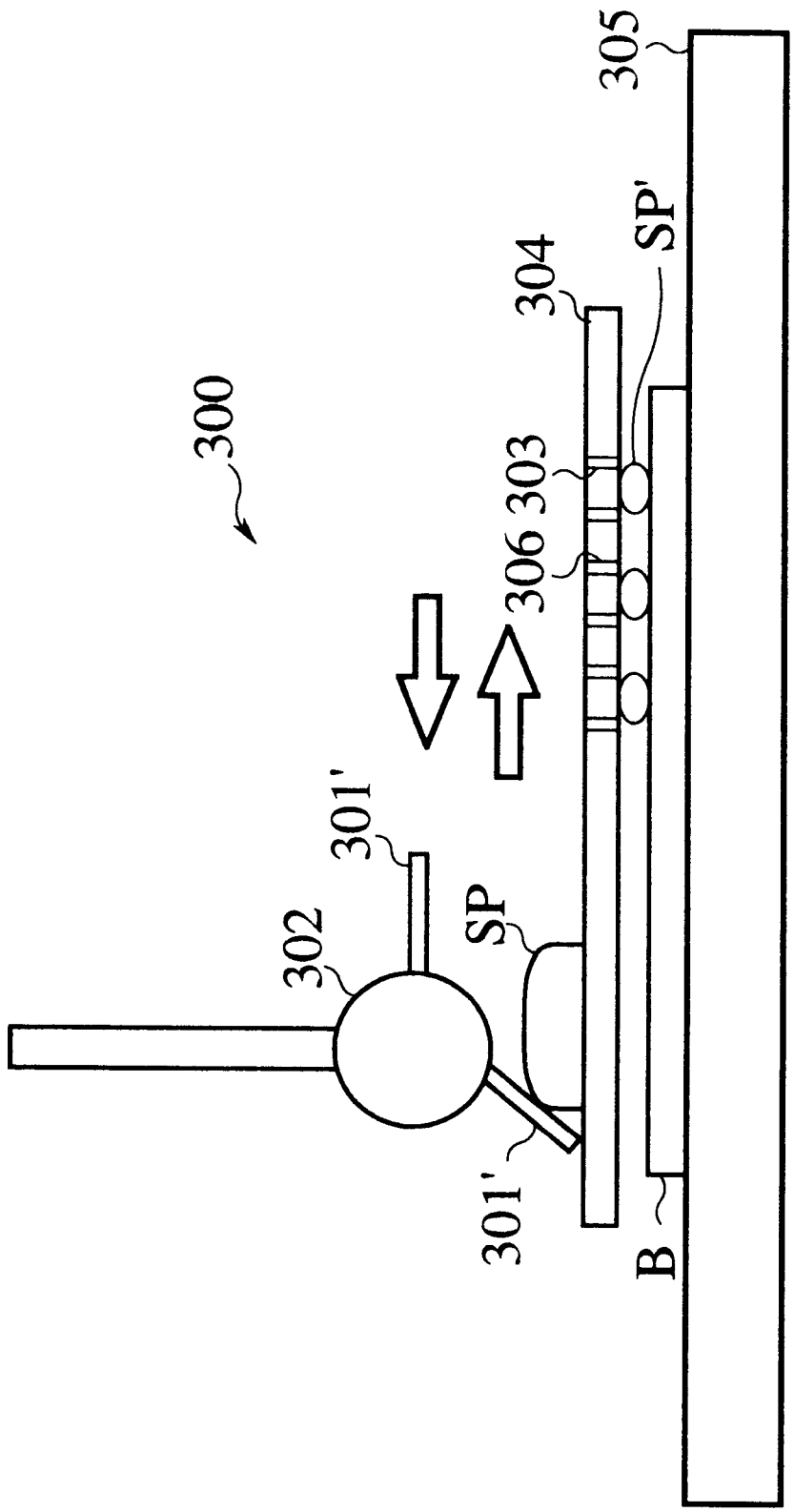
FIG. 13 is a schematic structure diagram showing still another embodiment of the apparatus for supplying the bonding material according to the present invention.

FIG. 13 shows an example of the screen printing mechanism using a screen in which metallic oxide film is formed. This screen printing mechanism 300 comprises a rotary unit 302 provided with squeegees 301, 301', a screen 304 having slits 303, and a base 305 for supporting the substrate B. On inside walls of the slits 303 in the screen 304 formed are zinc oxide films 306. The zinc oxide film 306 is formed by applying zinc oxide powder diffused in a liquid, on the inside wall of the slits 303, drying it and baking by heating.

The screen 304 of the screen printing mechanism 300 is set at an appropriate position such that it overlies the substrate B, and solder paste SP is supplied to an end on the screen 304. The rotary unit 302 is moved horizontally such that the squeegee 301 slides over the screen 304 so as to carry solder paste SP to the other end of the screen 304. Consequently, the slits 303 are filled with the solder paste SP. Further, the rotary unit 302 is rotated so as to make the squeegee 301' into contact with the screen 304 and return the squeegee 301' to the first end of the screen 304 thereby completing filling of the solder paste SP. After that, the solder paste SP in the slit 303 is heated so as to reflow, in order to evaporate or decompose flux contained in the solder paste SP, thereby removing it. Then the solder components of the solder paste SP is melted. After that, by cooling, the solder component is hardened in the slit 303. By raising the screen 304 to remove it from the substrate B, only the hardened solder component is left on the substrate B. Since the inside wall of the slit 303 has oxide film, solder component is prevented from adhering to the inside wall of the slit 303.

According to the present invention, melted metal containing zinc which was conventionally assumed to be inappropriate for soldering work is utilized to bond the members to be bonded, and bonding of electronic parts without lead can be formed. Further, since the bonding portions formed on the substrate according to the present invention has a surface zinc layer, migration is prevented in the bonding portions of the electric/electronic devices which are assembled using this substrate. Therefore, high quality can be assured in high density mounting electric/electronic devices.

EXAMPLES

Now the present invention will be described in detail with reference to examples.

Example 1

According to composition shown in Table 2, tin and zinc were mixed and heated so as to be melted. Then, phosphor was added and mixed. Then slag was removed and the melted material was poured into a mold. Tin-zinc solder alloys shown in Sample Nos. 1 to 8 were obtained. In the same manner, the tin-zinc solder alloy of the Sample No. 9 was obtained. Table 2 shows a result of measurement of the content of oxygen and melting point.

Next, a pair of copper plates were soldered under nitrogen environment, using each of the solder alloys of the specimens 1 to 9 to bond the copper pplates. At this time, the heating temperature for soldering was kept in a temperature range 10 to 30 K higher than the melting point of each specimen. During soldering work, wettability of each melted solder alloy was checked by the eyes and estimated by whether at least 98% of the surface of the copper plates was wetted by the solder alloy (A) or not (B). After soldering, ductility of the solder bonding was measured by the tensile test and estimated by whether ductility reached to 40% (A) or not (B). Table 2 shows a result of this survey.

TABLE 2

| Sample No. | Soldering Alloy | | | Characteristic | | | |
|---|---|---|---|---|---|---|---|
| | Composition (wt %) | | | Cont. Oxgen (ppm) | M.P. (K) | Wett- abil- ity | duct- ility |
| | Zinc | Others | Tin | | | | safety |
| 1 | 9 | — | balance | 20 | 471 | A | A | A |
| 2 | 9 | — | balance | 100 | 471 | A | A | A |
| 3 | 9 | — | balance | 150 | 471 | B | A | A |
| 4 | 5 | — | balance | 32 | 486 | A | A | A |
| 5 | 9 | Bi:5 | balance | 28 | 464 | A | A | B |
| 6 | 9 | In:5 | balance | 18 | 452 | A | A | B |
| 7 | — | Pb:37 | balance | 121 | 456 | A | B | A |

As evident from Table 2, the tin-zinc alloy solders of the Sample Nos. 1 to 4 have a low melting point and as excellent wettability as the tin-lead alloy solder of the Sample No. 9. That is, the solder of Sample Nos. 1 to 4 have an excellent soldering characteristic. The letter B of the estimation of the safety of tin-lead means that there is a fear in toxicity affecting the environment.

In regard to the alloy solders of Sample Nos. 5 and 6, the results of ductility means that addition of bithmus or indium inhibits formation of the surface zinc layer on the bonding interface, which causes deterioration of ductility. Moreover, it also causes difficulty in separation and purification of each component of the solder for recycling use.

Example 2

A solder was prepared under very low oxygen environment using phosphor like in the example 1, so as to obtain a solder in which tin is at least 90.9 wt %, zinc is 9 wt %, oxygen content is at most 5 ppm and other element content is less than 0.1 wt %. Then that solder was thrown into a melting bath 101 of the soldering unit 100 of FIG. 11. The environment was kept at 220° C. which is 22° C. higher than the eutectic point of 198° C. as its theoretical value to melt the solder completely. The inside wall of a nozzle 103 of the soldering unit 100 had an chromium oxide film formed in thickness of 100 Å. A bore of the nozzle port 103' was 1 mm. When the temperature of solder reached 190° C., nitrogen gas was supplied as inactive gas from a gas supplying unit 109. As a result, oxygen concentration in the vicinity of the nozzle port 103' became less than 250 ppm.

The nozzle port 103 was heated at 220° C. and while supplying melted solder from the melting bath 101 to the nozzle 103, elastic wave having a frequency of 15 to 30 kHz was output from an oscillator 105 provided on the nozzle 103. Then, it was recognized that fine solder particles were emitted from the nozzle.

Then, using a substrate 115 having a specification described below, the nozzle 103 was positioned so that a distance between the nozzle port 103' and the substrate 115 was 5 mm when the substrate 115 was positioned just below the nozzle 103. The substrate was moved horizontally at a speed of 3 cm/second passed through a heated range at 210°

C. by a heater. Melted solder drops were emitted from the nozzle port 103' when the substrate passed a predetermined position, so that they dropped on an objective pad position on the substrate. By moving the substrate in the pad direction, emission of solder drops was continued to apply the solder onto the entire surface of the pad with a predetermined length. The applied solder began to harden when reaching to a temperature below the eutectic point.

[Specification of the Substrate]

Size: 35 mm×100 mm material: conductive portion/copper, nickel plating and gold flash plating resin portion/glass epoxy resin, resist processing pad pattern: 150 µm in width×15 mm in length interval between pads: 100 µm After cooling, a portion in which solder was hardened was sliced vertically and its cross section was observed. Then, it was confirmed that the wetting angle was less than 90 degrees, indicating that wettability with solder was excellent. There was no bridge formed between pads. Further, an analysis in depth direction was conducted in the center portion of the pad up to a depth of about 100 Å according to Auger electron spectroscopy. As a result, a small amount of carbon attached to the surface was found and a layer containing zinc and oxygen in thickness of about 70 Å was found on the surface. However, no tin was found. Further therebelow, a layer in which zinc and tin existed in weight ratio of about 1:9 was found. The carbon on the surface is considered to have been generated due to carbonization of substance in the neighborhood such as resist. It is considered that a layer containing a large amount of zinc and oxygen existing on the surface inhibits penetration of oxygen from the atmosphere into the inside thereof.

Using the above substrate, an assembly was formed by mounting QFP as active part, and a resistor and a display unit as passive part, and then operated. Consequently, generation of migration was not found.

A substrate in which the pad width was 50 µm and pad interval was 50 µm was coated with the solder in the same manner as above. Then, wettability of the solder and pad was observed after cooling. Then, wetting angle was less than 90 degrees and it was confirmed that the wettability with the solder was excellent. Further, there was no bridge with the solder found between the pads.

Example 3

Alloy particles of 10 to 50 µm in diameter, having the same composition as the solder used in Example 2 was prepared. A substrate according to a specification below was moved at a speed of 3 cm/second so that it passed through an exit of a passage filled with argon gas heated at 220° C. Alloy particles were introduced to this passage and carried to reach the substrate. During passing through the passage, the surfaces of the alloy particles were melted so that they adhered to the substrate pad.

[Substrate Specification]

size: 35 mm×100 mm material: conductive portion/copper, nickel plating resin portion/glass epoxy resin, resist processing pad pattern: 200 µm (width)×15 mm (length)

pad interval: 200 µm

After cooling, a portion in which the solder was hardened was sliced vertically and its cross section was observed. Then, it was confirmed that the wetting angle was less than 90 degrees, indicating that wettability with solder was excellent. There was no bridge formed between pads. Further, an analysis in depth direction was conducted in the center portion of the pad up to a depth of about 100 Å according to Auger electron spectroscopy. As a result, a small amount of carbon attached to the surface was found and a layer containing zinc and oxygen in thickness of about 80 Å was found on the surface. Moreover, about 1% tin was detected in this layer. Therebelow, a layer in which zinc and tin existed in weight ratio of about 1:9 was found. On an interface between the pad and the solder, a layer of about 1 µm in thickness containing oxygen of about 10 ppm, in which a ratio of content of zinc was at least 70 wt % was found in accordance with energy diffusion type X-ray spectral analysis.

Using the above substrate, as shown in FIG. 2, an assembly was formed by mounting QFP as active part, and a resistor and a display unit as passive part, and then operated. Consequently, generation of migration was not found.

Example 4

Using phosphor like in example 1, a solder in which, in terms of composition ratio, tin was at least 92.4 wt %, zinc was 7 wt %, silver was 0.5 wt %, other metallic elements content was less than 0.1 wt % and oxygen content was at most 5 ppm was prepared under very low oxygen environment. This was processed to foil having an equal thickness of 20 µm and wound up in the form of roll.

A PC board having a specification below was introduced to a chip mounter using a transfer apparatus and the board was stopped at a predetermined position by means of a CCD camera. Helium was supplied as inactive gas and while keeping the concentration of oxygen in a range of 50 ppm to 250 ppm, the aforementioned solder foil of 20 µm in thickness was placed so as to cover the pad of the substrate and then a metal head (having chromium oxide film on the surface) was pressed momentarily from above the pad at the aforementioned predetermined position so as to apply a pressure of 20 MPa. The solder foil was fused to the pad due to the applied pressure. The solder foil which did not overlap the pad was collected by winding up. The collected solder foil could be reused as an equal thickness foil.

[Specification of the Substrate]

size: 35 mm×100 mm material: conductive portion/copper resin portion/glass epoxy resin, resist processing pad pattern: 200 µm in width×15 mm in length pad interval: 200 µm Observing a substrate picked out of the mounter by means of a microscope, no thin spot, drooping, and bridge were seen on the solder adhering to the pad and the solder was spread almost equally at a thickness of about 8 µm. Further, analysis in depth direction according to Auger electron spectroscopy method was carried out in the vicinity of the pad, up to about 120 Å. As a result, a small amount of carbon adheres to the surface and a layer composed of zinc and oxygen of about 80 Å in thickness was found on the surface. Further therebelow, a layer containing zinc and tin in the weight ratio of 1:9 was found. As a result of measurement in the vicinity of an interface between the pad and the solder according to energy diffusion type X-ray spectral analysis, a layer of about 1 µm in thickness containing oxygen of about 10 ppm, in which the ratio of content of zinc was about 80 wt %, was found.

Example 5

Using phosphor like in example 1, solder in which, in terms of composition ratio, tin was at least 90.9 wt %, zinc was 9 wt %, other metallic elements content was less than 0.1 wt % and oxygen content was at most 20 ppm was prepared under very low oxygen environment. This was processed to foil having an equal thickness of 15 µm and wound up in the form of roll.

Using a substrate having specifications described below and the aforementioned foil, the same operation as in the Example 4 was repeated so as to obtain a substrate in which the solder foil was fused to the pad.

[Specification of the Substrate]
size: 35 mm×100 mm
material: conductive portion/stainless steel SUS 316 resin portion/glass epoxy resin, resist processing
pad pattern: 200 µm in width×15 mm in length
pad interval: 200 µm Observing the substrate picked out of the mounter by means of a microscope, no thin spot, drooping or bridge was found on the solder adhering to the pad, and the solder was stretched almost equally. Analysis in the depth direction according to Auger electron spectroscopy method was carried out up to a depth of about 100 Å in the vicinity of the center of the pad. As a result, a small amount of carbon adhere to the surface, and a layer composed of zinc and oxygen having a thickness of about 60 Å existed on the surface portion. Further therebelow, a layer in which zinc and tin existed in the weight ratio of 1:9 was found.

Example 6

Using phosphor like in example 1, solder in which, in terms of composition ratio, tin was at least 90.9 wt %, zinc was 9 wt %, other metallic elements content was less than 0.1 wt % and oxygen content was at most 5 ppm was prepared under very low oxygen environment. This was processed to foil having an equal thickness of 15 µm and wound up in the form of roll.

An IC chip having a specification below was introduced to a chip mounter using a transfer apparatus and the IC chip was stopped at a predetermined position by means of a CCD camera. Argon gas was supplied to the IC chip as inactive gas and while keeping the concentration of oxygen in a range of 50 ppm to 250 ppm, the aforementioned solder foil of 15 µm in thickness was placed so as to cover the lead of the IC chip and YAG laser was irradiated over the lead at a predetermined position for 50 mseconds. Due to irradiation of laser, the solder foil was fused to the pad. The solder foil which did not overlap the lead was collected by winding up. The collected solder foil could be reused as an equal thickness foil.

[Specification of the IC Chip]
material: conductive portion/42 alloy resin portion/ unsaturated polyester resin
lead pattern: 190 µm in width×14 mm in length
pad interval: 220 µm Example 7

Using phosphor in the same manner as the example 1, a solder in which, in terms of composition ratio, tin was at least 90.9 wt %, zinc was 8.7 wt %, silver was 0.3 wt %, other metallic elements content was less than 0.1% and oxygen content was at most 15 ppm was prepared. Then, it was processed to solder powder having an almost equal sphere of 20 µm in diameter. By diffusing 90 parts by weight of this solder powder in 10 parts by weight of organic flux (containing 2-alkyl-1,3-hexandiol as a main solvent component, product by Senju Kinzoku Kogyo Kabushiki Kaisya of Tokyo, Japan), solder paste was prepared.

By using a screen printing machine 300 shown in FIG. 13, a substrate B having specifications below was fixed and purged with nitrogen gas. Then, a screen 304 having specifications below was placed so as to coincide with the pad of the substrate B, and the solder paste prepared previously was placed on one end of the screen 304. By reciprocating a rotary body 302 horizontally along the screen 304, the solder paste was charged in the slit 303 by means of squeegees 301, 301'.

[Specifications of the Substrate]
size: 150 mm×150 mm
material: conductive portion/copper resin portion/glass epoxy resin, the surface processed by resist.
pad pattern: 100 µm
pad interval: 100 µm
[Printing Condition]
Printing time: 40 seconds/tact
[Specifications of the Screen]
thickness: 0.15 mm
material: stainless steel SUS 316
slit: 100 µm in width×15 mm in length, inside surface coated with zinc oxide film After that, solder paste in the slit 303 was heated at 150° C. so as to reflow, thereby removing flux by evaporation or decomposition. Then, the temperature was raised to 220° C. to melt the solder powder. After that, the substrate was cooled to harden the solder and the screen 304 was removed from the substrate.

Then, the substrate was introduced to the chip mounter by means of the transfer apparatus, and the substrate was stopped at a predetermined position by means of a CCD camera. Helium was supplied to the substrate as inactive gas, and while keeping the concentration of oxygen in a range of 50 ppm to 250 ppm, a QFP chip was mounted on the soldered pad. Next, the substrate in which the chip was mounted was introduced into the reflow furnace. Nitrogen gas was supplied to the reflow furnace as inactive gas and while preventing oxygen to exist inside, the temperature was raised up to 220° C. so as to melt the solder. After that, the substrate was picked out of the furnace and left to cool.

Observing the picked out substrate by means of a microscope, no drooping of solder or formation of bridge was found. Further, bonding strength was measured with respect to the bonded chip. As a result, the bonding strength was 8 N on average, and it was found that it indicated almost the same or more value as indicated by using a conventional tin-lead series paste solder.

Example 8

Using phosphor in the same manner as in the example 1, solder in which, in terms of composition ratio, tin was at least 90.9 wt %, zinc was 9 wt %, other metallic element content was less than 0.1% and oxygen content was at most 15 ppm was prepared and it was processed to solder powder having an almost equal sphere of 10 µm in diameter. Then 88 parts by weight of this solder powder was diffused into 12 parts by weight of organic series flux (containing 2-alkyl-1,3-hexandiol as a main solvent component, product by Senju Kinzoku Kogyo Kabushiki Kaisya of Tokyo, Japan) so as to prepare solder paste.

Using the aforementioned solder paste and a screen having specifications below as a screen of the screen printing machine 300, the same operation as in the Example 7 was repeated to mount the small size active part on a silicone wafer having specifications below.

[Specification of the Silicone Wafer]
size per section: 15 mm×15 mm
surface: Polishing
Bonding pattern: 100 μm
Bonding interval: 200μm
[Printing Condition]
time: 40 seconds/tact
[Screen Specifications]
thickness: 0.15 mm
material: stainless steel SUS316
Slit: 100 μm, inside surface coated with titanium oxide film.

Observing a picked out silicone wafer by means of a microscope, no drooping of solder or formation of bridge was found. The bonding strength was measured about the bonded part. As a result, the bonding strength was 14 N on average, and it was found that almost the same or more strength as a conventional conductive adhesive agent was indicated.

Example 9

Using phosphor in the same manner as in the example 1, solder in which, in terms of composition ratio, tin was at least 90.9 wt %, zinc was 9 wt %, oxygen content was at most 5 ppm, and other metallic element content (Bi, Ag, In, Cu) was less than 0.1 wt % was prepared under very low oxygen environment.

This solder was thrown into a melting bath of argon environment, and by keeping the temperature at 220° C. which is 22° C. higher than the eutectic point of 198° C. as a theoretical value, the solder was melted. When the solder temperature reached 190° C., argon gas was supplied to the vicinity of the nozzle port which was connected to the melting bath as inactive gas. As a result, the concentration of oxygen in the vicinity of the nozzle became less than 250 ppm.

Next, a copper pad on which a fine device could be mounted and an insulating substrate for high density mounting having copper wiring on the surface, based on specifications below were moved horizontally at a speed of 3 cm/second so as to pass just below the nozzle. The melted solder was dropped from the nozzle and applied onto the wiring and pad. When the temperature of the substrate dropped below the eutectic point temperature, the coated solder was immediately hardened. Then, the substrate was turned back and the same operation was repeated so as to apply the solder onto wiring on the back face.

As shown in FIG. 3, a packaged LSI as an active part and a resistor as a passive part were mounted by solder on the front surface of a substrate coated with the solder. Further, a resistor was bonded to a pad on the back face of the substrate and fixed securely.

Figure 14:
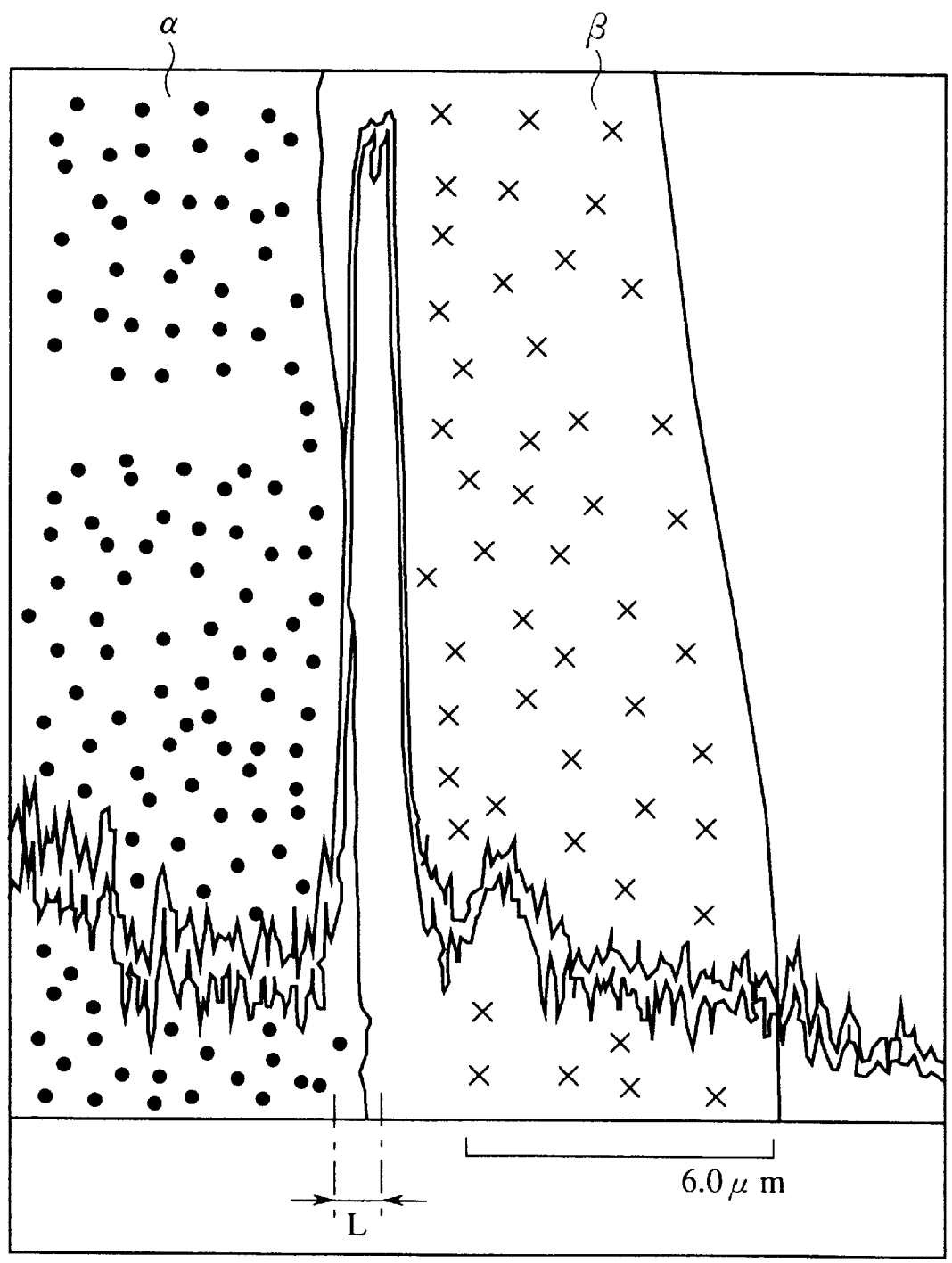
FIG. 14 is a chart of linear analysis of the amount of zinc, by energy diffusion type X-ray spectral analysis, in the vicinity of a bonding interface between the bonding portion of the bonding material and a bonding member of the substrate for mounting the electronic part according to the present invention.

[Specification of the Substrate]
size: 35 mm×100 mm
material: conductive portion/copper, nickel plating or gold flash plating resin portion/glass epoxy resin, resist treatment
pad pattern: 100 μm in width×15 mm in length
pad interval: 200 μm After cooling, a portion in which solder was hardened was sliced vertically and observed in its cross section. As a result, it was found that wetting angle of the solder relative to the pad and wiring was less than 90 degrees, indicating that the wettability to the solder was excellent. No bridge was seen between the pads. Linear analysis on distribution condition of zinc in the vicinity of an interface between the pad and solder was carried out in the center of the pad. FIG. 14 shows this result. Referring to FIG. 14, the region α indicates a pad and the region β indicates solder. From a result of the linear analysis, it is found that the layer L of 1 μm containing a large amount of zinc covers the pad. The concentration of zinc rises steeply on an interface of the pad in the layer L and then gradually decreases as it leaves the interface toward inside of the solder. As described above, the layer L was formed such that zinc was concentrated from the solder on the bonding interface. The layer L acts to enhance bonding between the pad and the solder. Further, the layer L contains oxygen of about 1 to 30 ppm, which is larger than the amount of oxygen in the solder in the region β. That is, oxygen in the solder is concentrated upon the layer L. It is considered that this also contributes to enhancement of the bonding of the solder.

Using tin-zinc solders having different amounts of zinc, according to the same operation above, a copper pad, a silver pad and a gold pad of the insulating substrate were soldered so as to mount electronic parts. The ratio of content of zinc in the layer L, composed of mainly zinc, formed on an interface of the soldered bonding portion was measured and further a tension force necessary for peeling out the mounted part from the soldered bonding portion was measured so as to estimate the bonding strength. Table 3 shows the result of this estimation. Referring to Table 3, the letter A indicates the bonding showing the same as or higher bonding strength than that of ordinary tin-lead solders (about 3.5 kgf/mm²), and the letter B indicates parts inferior to the tin-lead solder or which failed to be bonded.

TABLE 3

| | Bonding Strength Zinc Content in the Layer L (wt %) | | |
|---|---|---|---|
| Pad | 50 | 88 | 99.5 |
| copper | B | A | A |
| silver | B | A | A |
| gold | B | A | A |

As evident from the above description, bonding strength of the solder differs depending on the ratio of content of zinc in the layer L. Bonding portions which indicated excellent bonding have fewer fine cavities created in the solder than ordinary tin-lead solders. It is considered that this improved the tension strength.

From Table 3, it is found that the layer L composed of mainly zinc forms excellent bonding with gold, silver and copper. Further, even if a member to be bonded is a mixture material composed of mainly gold, silver or copper and other metal, the same excellent bonding can be achieved.

Table 4 shows a relation between the compositions of the layer L and the hardened tin-zinc solder and bonding strength in a case when the bonding is formed in such a condition that the layer L composed of mainly zinc, exists between a copper member to be bonded and the tin-zinc solder. Control of the compositions of the Layer and the hardened tin-zin solder was achieved by changing the composition of the used tin-zinc solder containing 5 to 13 wt % zinc, changing the temperature at which the melted tin-zinc solder was held in the melting bath within a range of 205 to 235° C., and changing the cooling speed of the solder applied to the copper member. In Table 3, the letter A shows the bonding strength being 5 kgf/mm2 or more, the letter B shows that of 3.5 to 5.0 kgf/mm$^2$, and the letter C shows that of being less than 3.5 kgf/mm$^2$.

TABLE 4

| Zinc Content of Hard Solder | Bonding Strength Zinc Content in the Layer L (wt %) | | | |
| --- | --- | --- | --- | --- |
|  | 50 | 88 | 95 | 99.5 |
| 4.8 | C | C | C | C |
| 5.8 | C | B | B | B |
| 8.8 | C | B | A | A |
| 10 | C | B | A | A |
| 11.7 | C | B | B | B |
| 12.3 | C | C | C | C |

From the above result, it is understood that when the ratio of content of zinc in the layer L is 88 to 99.5 wt %, and when the hardened solder contains 5.8 to 11.7 wt % zinc, an excellent bonding strength can be obtained.

Example 10

Using phosphor in the same manner as in the example 1, solder in which, in terms of composition ratio, tin was at least 90.9 wt %, zinc was 9 wt %, oxygen content was at most 5 ppm and other metallic elements content was less than 0.1 wt % was prepared under very low oxygen environment. Argon gas was blown into a leveler plating solder bath so as to obtain non-oxidizing environment, in which solder is thrown and melted. A substrate having specifications below, provided with the pad is immersed in melted solder. Consequently, a substrate in which leveler plating layer was uniformly formed by solder was obtained.

[Specification of the Substrate]

size: 35 mm×100 mm material: conductive portion/iron resin portion/glass epoxy resin, resist treatment pad pattern: 200 μm in width×15 mm in length pad interval: 200 μm Observing an obtained substrate by means of a microscope, it was found that the wetting angle between the solder and the pad was less than 90 degrees, indicating that the wettability to solder was excellent. No bridge due to solder was seen between the pads. Further, linear analysis according to energy diffusion type X-ray spectral method was carried out in the vicinity of an interface between the solder and the pad, in the center of the pad. Consequently, in a solder layer of 12 μm in thickness, a layer having a thickness of about 2 μm, in which the content of zinc was about 75 wt % was found.

Example 11

Using an IC chip having specifications below instead of the substrate, parts mounting was carried out as shown in FIG. 2 and the same operation as in the Example 9 was repeated so as to obtain an IC chip on which parts were mounted. QFP as an active part and resistors as a passive part were mounted on the back face of the IC chip and LSI was mounted as an active part on the back face thereof. Mounting parts on both sides can raise the mounting density.

[Specification of the IC Chip]

material: conductive portion/42 alloy resin portion/ unsaturated polyester resin Lead pattern: 190 μm in width×14 mm in length Pad interval: 220 μm As described above, according to the present invention, by using a bonding material composed of metallic composition without lead, electronic parts are mounted on a mounting substrate. As a result, an electronic-part-mounted substrate in which migration is prevented is obtained. Further, according to the present invention, the bonding material can be supplied to fine portions accurately, so that mounting of parts on the high density mounting substrate is facilitated. The bonding strength is excellent. Further, according to the present invention, there is provided a mounting substrate having bonded parts likely to have a sufficient strength at bonding portions formed with bonding material, and a sufficient resistance to distortion. Thus, this is advantageous in terms of industry and environmental protection.

It must be understood that the invention is in no way limited to the above embodiments and that many changes may be brought about therein without departing from the scope of the invention as defined by the appended claims.

What is claimed is:

1. A substrate for mounting an electronic part, comprising:
    an electrically conductive bonding member provided on a substrate; and
    a bonding portion which is formed of a solder alloy on the electrically conductive bonding member, in which the solder alloy comprises a zinc component and a tin component and has a first layer at the interface of the electrically conductive bonding member and the bonding portion, and the content of the zinc component of the first layer is concentrated to approximately 70% by weight or more, wherein the content of an oxygen component of the solder alloy is 100 ppm or less.

2. The substrate according to claim 1, wherein the first layer has a thickness of approximately 1 μm.

3. The substrate according to claim 1, wherein the content of the zinc component of the first layer is 95% by weight or more.

4. The substrate according to claim 1, wherein the solder alloy has a second layer being adjacent to the first layer, and the content of the zinc component of the second layer is 5.8 to 11.7% by weight.

5. The substrate according to claim 1, wherein said zinc component is present from about 3% to about 12% of the solder composition.

6. The substrate according to claim 1, wherein the content of the zinc layer of the first layer is 88% by weight or more.

7. The substrate according to claim 1, wherein the electrically conductive bonding member has a surface comprising a metal selected from the group consisting of copper, silver, nickel, gold, palladium, platinum and iridium.

8. The substrate according to claim 1, wherein the electrically conductive bonding member comprises a plurality of bumps or leads provided in a high density mounting with an interval of 1 mm or less.

9. The substrate according to claim 1, wherein the bonding portion bonds to the electrically conductive bonding member at a bonding strength of 3.5 kgf/mm$^2$ or more.

10. The substrate according to claim 1, wherein the bonding portion bonds to the electrically conductive bonding member at a bonding strength of 5 kgf/mm$^2$ or more.

11. A substrate on which an electronic part is mounted, comprising:
    an electrically conductive bonding member provided on a substrate; and
    a bonding portion connecting the electronic part with the electrically conductive bonding member of the substrate, the bonding portion being formed of a solder alloy on the electrically conductive bonding member, in which the solder alloy comprises a zinc component and a tin component and has a first layer at the interface of the electrically conductive bonding member and the bonding portion, and the content of the zinc component of the first layer is concentrated to approximately 70% by weight or more, wherein the content of an oxygen component of the solder alloy is 100 ppm or less.

12. The substrate according to claim 11, wherein the solder alloy further has a surface layer in which the zinc component is concentrated so that the content of the tin component is at most approximately 1% by weight.

13. The substrate according to claim 11, wherein the surface layer has a thickness of approximately 30 to 120 Å.

14. The substrate according to claim 11, wherein the electrically conductive bonding member has a surface comprising a metal selected from the group consisting of copper, silver, nickel, gold, palladium, platinum and iridium.

15. The substrate according to claim 11, wherein the electrically conductive bonding member comprises a plurality of bumps or leads provided in a high density mounting with an interval of 1 mm or less.

16. The substrate according to claim 11, wherein the bonding portion bonds to the electrically conductive bonding member at a bonding strength of 3.5 kgf/mm$^2$ or more.

17. The substrate according to claim 11, wherein said zinc component is present from about 3% to about 12% of the solder composition.

18. The substrate according to claim 11, wherein the content of the zinc layer of the first layer is 88% by weight or more.

19. A substrate for mounting an electronic part, comprising:

an electrically conductive bonding member provided on a substrate; and a bonding portion which is formed of a metallic composition on the electrically conductive bonding member, in which the metallic composition comprises a zinc component and a tin component and includes a surface layer in which the zinc component is concentrated so that the content of the tin component is at most approximately 1% by weight, wherein the content of an oxygen component of the solder alloy is 100 ppm or less.

20. The substrate according to claim 19, wherein the surface layer has a thickness of approximately 30 to 120 Å.

21. The substrate according to claim 19, wherein the content of the zinc component of the metallic composition is 0.5% by weight or more.

22. A substrate on which an electronic part is mounted, comprising:

an electrically conductive bonding member provided on a substrate; and a bonding portion connecting the electronic part with the electrically conductive bonding member of the substrate, the bonding portion being formed of a metallic composition on the electrically conductive bonding member, in which the metallic composition comprises a zinc component and a tin component and includes a surface layer in which the zinc component is concentrated so that the content of the tin component is at most approximately 1% by weight, wherein the content of an oxygen component of the solder alloy is 100 ppm or less.

* * * * *